US010552261B2

(12) United States Patent
Hashizume et al.

(10) Patent No.: US 10,552,261 B2
(45) Date of Patent: Feb. 4, 2020

(54) SEMICONDUCTOR DEVICE AND MEMORY MODULE

(71) Applicant: Renesas Electronics Corporation, Tokyo (JP)

(72) Inventors: Takeshi Hashizume, Tokyo (JP); Naoya Fujita, Tokyo (JP); Shunya Nagata, Tokyo (JP); Yoshisato Yokoyama, Tokyo (JP); Katsumi Shinbo, Tokyo (JP); Kouji Satou, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 78 days.

(21) Appl. No.: 15/984,572

(22) Filed: May 21, 2018

(65) Prior Publication Data
US 2018/0349222 A1 Dec. 6, 2018

(30) Foreign Application Priority Data

Jun. 2, 2017 (JP) .................................. 2017-109880
Nov. 29, 2017 (JP) .................................. 2017-229137

(51) Int. Cl.
*G06F 11/00* (2006.01)
*G06F 11/10* (2006.01)
*G11C 29/52* (2006.01)
*G06F 3/06* (2006.01)
*G11C 11/413* (2006.01)

(52) U.S. Cl.
CPC .......... *G06F 11/1068* (2013.01); *G06F 3/064* (2013.01); *G06F 3/0619* (2013.01); *G06F 3/0659* (2013.01); *G06F 3/0679* (2013.01); *G11C 29/52* (2013.01); *G11C 11/413* (2013.01)

(58) Field of Classification Search
None
See application file for complete search history.

(56) References Cited

U.S. PATENT DOCUMENTS

| 2008/0126876 | A1* | 5/2008 | Lee ..................... G06F 11/1016 714/42 |
| 2008/0151659 | A1* | 6/2008 | Sakuma ................ G11C 29/40 365/200 |
| 2009/0135660 | A1* | 5/2009 | Imai ..................... G11C 29/02 365/189.05 |
| 2015/0310926 | A1* | 10/2015 | Akamatsu ............. G11C 17/18 365/96 |
| 2016/0283339 | A1* | 9/2016 | Yamate ............... G06F 11/1016 |
| 2017/0352434 | A1* | 12/2017 | Ryu ..................... G11C 5/005 |

FOREIGN PATENT DOCUMENTS

JP 2016-66337 A 4/2016

* cited by examiner

Primary Examiner — Daniel F. McMahon
(74) Attorney, Agent, or Firm — Sughrue Mion, PLLC

(57) ABSTRACT

A selection decoder controls levels of a plurality of selection signals based on an address bit having at least one or more bits. A memory module is selected when its corresponding selection signal is at an activated level, and data can be read and written therein. A failure determination unit determines whether or not the selection decoder is in a failed state based on the levels of the plurality of selection signals.

20 Claims, 26 Drawing Sheets

| CEN | Add[N] | cen1 | cen2 |
|---|---|---|---|
| 1 | 1 | 1 | 0 |
| 1 | 0 | 0 | 1 |
| 0 | 1 | 0 | 0 |
| 0 | 0 | 0 | 0 |

FIG.14

| Data[0:M] | CHECK BIT(Data[0:M]+Add[0:N]) |

SEMICONDUCTOR DEVICE AND MEMORY MODULE

This nonprovisional application is based on Japanese Patent Application No. 2017-109880 filed on Jun. 2, 2017, and No. 2017-229137 filed on Nov. 29, 2017, with the Japan Patent Office, the entire contents of which are hereby incorporated by reference.

BACKGROUND OF THE INVENTION

Field of the Invention

The present disclosure relates to a semiconductor device and a memory module, and is suitably applicable to, for example, a semiconductor device having a built-in memory.

Description of the Background Art

Conventionally, there have been known memory modules capable of detecting an error of data in a memory and correcting the data.

For example, Japanese Patent Laying-Open No. 2016-66337 describes that an ECC (Error Correction Code) encoding unit adds an error correcting code to write data to a memory and generates encoded data, and a first error detection unit performs error detection/correction processing on read data from the memory.

SUMMARY OF THE INVENTION

A device described in Patent Document 1 can detect a failure in a circuit which performs processing on data in a memory module and a wire which transfers the data.

However, the device described in Patent Document 1 has a problem that it cannot detect a failure in a circuit which performs processing on a memory address in the memory module and a wire which transmits the memory address.

Other problems and new features will become apparent from the description of the present specification and the accompanying drawings.

In one embodiment, a selection decoder controls levels of a plurality of selection signals corresponding to a plurality of memory modules based on an address bit having at least one or more bits. A failure determination unit determines whether or not the selection decoder is in a failed state based on the levels of the plurality of selection signals.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 14 is a view showing a configuration of data stored in a memory array in the eighth embodiment.

DESCRIPTION OF THE PREFERRED EMBODIMENTS

Figure 1:
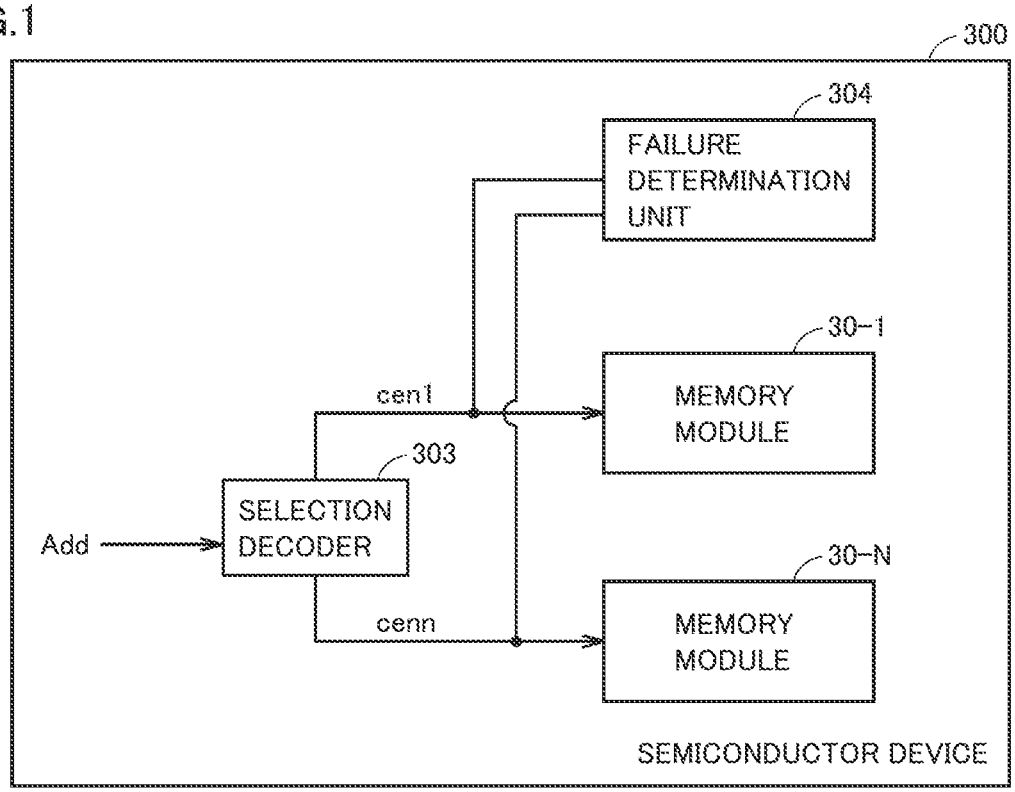
FIG. 1 is a view showing a configuration of a semiconductor device in a first embodiment.

Hereinafter, embodiments will be described using the drawings. In the drawings, identical components will be designated by the same reference numerals.

First Embodiment

FIG. 1 is a view showing a configuration of a semiconductor device 300 in a first embodiment.

Referring to FIG. 1, this semiconductor device includes N memory modules 30-1 to 30-N, a selection decoder 303, and a failure determination unit 304. N is a natural number more than or equal to two.

Selection decoder 303 controls levels of a plurality of selection signals cen1 to cenn based on an address bit having at least one or more bits.

Memory module 30-$i$ ($i=1$ to n) is selected when its corresponding selection signal cen1 is at an activated level, and data can be read and written therein.

Failure determination unit 304 determines whether or not selection decoder 303 is in a failed state based on the levels of the plurality of selection signals cen1 to cenn.

For future automatic driving, in-vehicle semiconductors are required to have functions for improving safety, and for example, they are required to be designed based on the standard ISO26262 (functional safety). This standard requires to assume a random failure such as aging deterioration of hardware, correct or detect a failure when it occurs, and perform danger avoidance processing. In addition, high reliability products are often equipped with an ECC function for a memory which is susceptible to malfunction due to radiation (α rays and neutrons). Thereby, not only destruction of held data due to radiation but also a random failure in data can be corrected or detected. On the other hand, there has been a problem that a failure in a circuit for processing an address, which is a non-data signal on which correction and error detection cannot be performed by an ECC, cannot be detected. According to the present embodiment, a failure in selection decoder 303 for processing an address that designates which of the plurality of memory modules should be selected can be detected.

[Semiconductor Device in Reference Example 1]

Figure 2:
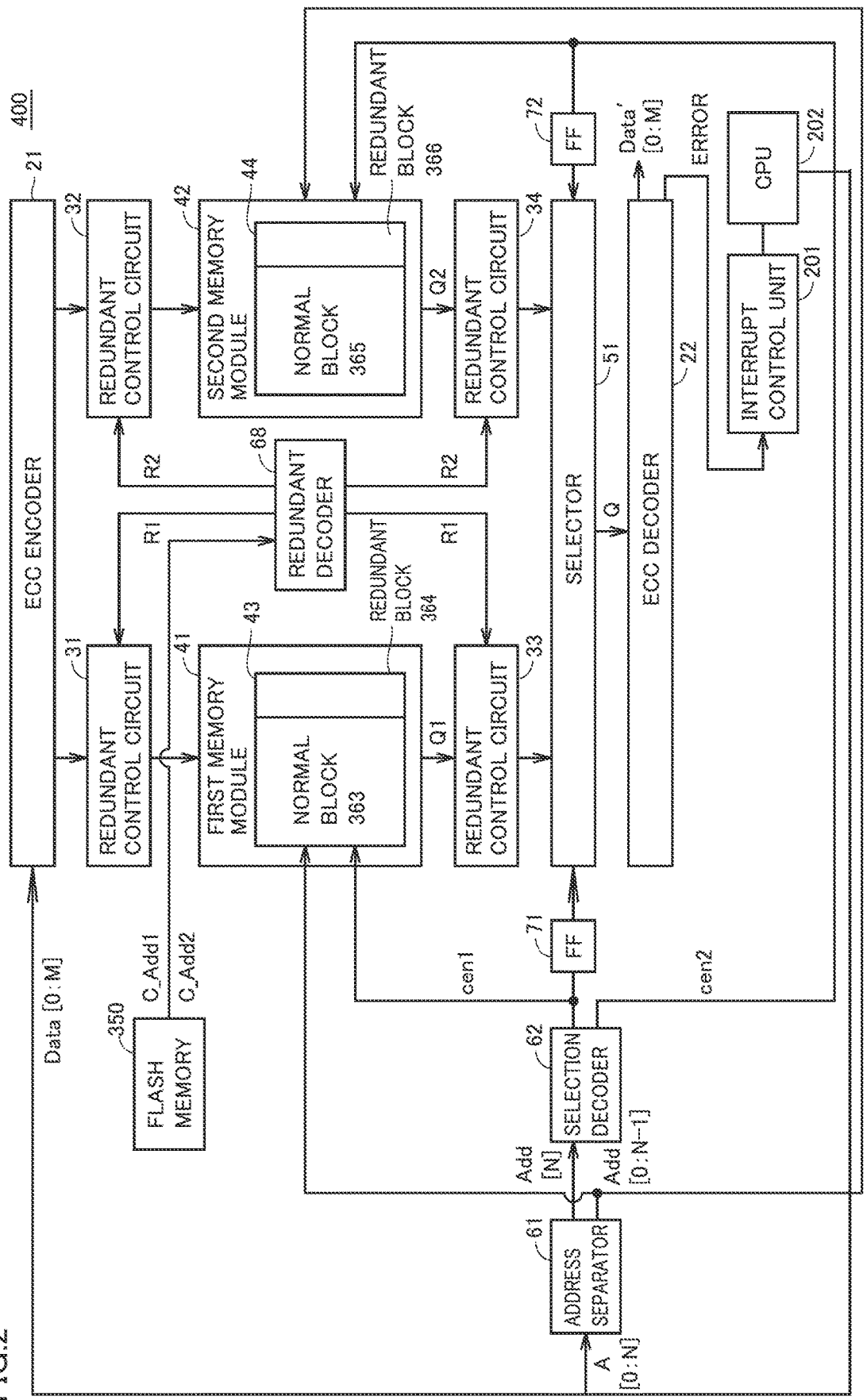
FIG. 2 is a view showing a configuration of a semiconductor device in a reference example 1.

FIG. 2 is a view showing a configuration of a semiconductor device 400 in a reference example 1.

Referring to FIG. 2, this semiconductor device 400 includes a first memory module 41, a second memory module 42, a flash memory 350, an ECC encoder 21, and redundant control circuits 31 to 34. Semiconductor device 400 further includes a selector 51, an ECC decoder 22, an address separator 61, a selection decoder 62, a redundant decoder 68, an interrupt control unit 201, a CPU 202, and flip-flops (FFs) 71 and 72.

Each of first memory module 41 and second memory module 42 is, for example, an SRAM (Static Random Access Memory) macro provided as a library in a design environment for semiconductor devices. Each of first memory module 41 and second memory module 42 can also be expressed by a word "memory unit", "memory block", or "memory macro".

First memory module 41 includes a memory array 43 having a plurality of SRAM memory cells, and an SRAM logic circuit.

Memory array 43 includes a normal block 363 and a redundant block 364. Normal block 363 is composed of a plurality of normal memory cell columns. The plurality of normal memory cell columns serve as a place where data is to be written, unless they are defective. Redundant block 364 is composed of one or more redundant memory cell columns. The one or more redundant memory cell columns are provided to relieve a defective memory cell column having a defective memory cell, among the plurality of normal memory cell columns included in normal block 363. The one or more redundant memory cell columns serve as a place where data is to be written, instead of the defective memory cell column.

Second memory module 42 includes a memory array 44 having a plurality of SRAM memory cells, and an SRAM logic circuit. Memory array 44 includes a normal block 365 and a redundant block 366. Normal block 365 is composed of a plurality of normal memory cell columns. Redundant block 366 is composed of one or more redundant memory cell columns.

Figure 3:
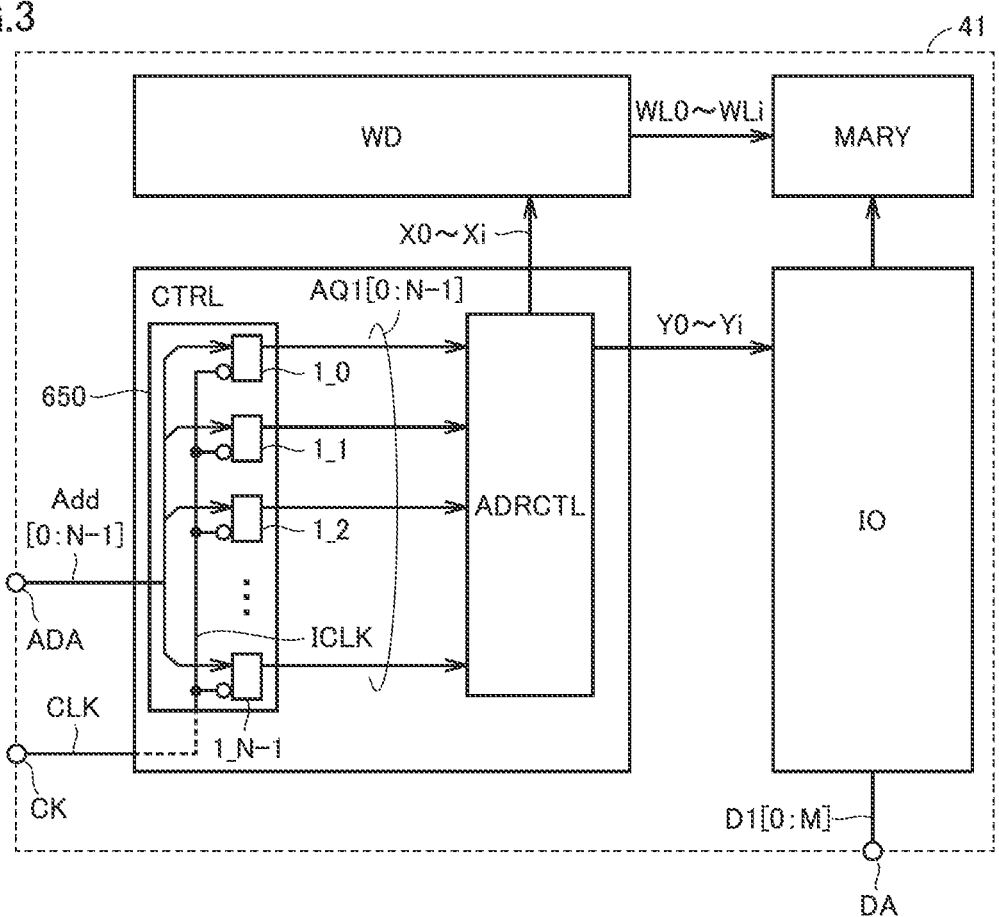
FIG. 3 is a view showing a configuration of a first memory module in reference example 1.

FIG. 3 is a view showing a configuration of first memory module 41 in reference example 1. The configuration of second memory module 42 is also the same as this configuration.

Referring to FIG. 3, first memory module 41 includes an address input terminal ADA, a clock input terminal CK, a data input/output terminal DA, a memory array MARY, a word line driving circuit WD, a data input/output unit IO, and a control unit CTRL.

A second address bit Add[0:N−1] sent from address separator 61 is input to address input terminal ADA. A clock CLK is input to clock input terminal CK. A data signal D1[0:M] is input/output to/from data input/output terminal DA.

Memory array MARY has a plurality of memory cells selected by word lines WL0 to WLi.

Control unit CTRL includes a temporary storage circuit 650 composed of latch circuits 1_0 to 1_N−1, and an address decoder ADRCTL. Latch circuits 1_0 to 1_N−1 capture address bits Add[0] to Add[N−1] in synchronization with clock CLK, and output them as internal address bits AQ1[0] to AQ1[N−1]. Latch circuits 1_0 to 1_N−1 keep holding captured address bits Add[0] to Add[N−1] until an edge of clock CLK is input. Address decoder ADRCTL outputs address decoding signals (X0 to Xi and Y0 to Yj) based on internal address bits AQ1[0] to AQ1[N−1].

Word line driving circuit WD selects and drives a corresponding word line WL in memory array MARY, based on row selection signals X0 to Xi of the address decoding signals.

Data input/output unit IO outputs data in a memory cell selected by word line WL in memory array MARY, as data signal D1[0:M], through data input/output terminal DA.

Data input/output unit IO writes data signal D1[0:M] input through data input/output terminal DA, in the memory cell selected by word line WL in memory array MARY.

Referring to FIG. 2 again, address separator 61 separates an (N+1)-bit address signal A[0:N] output from CPU 202 into a first address bit Add[N] (having a second number of higher-order bits) which is the most significant bit and N-bit second address bit Add[0:N−1] (having a first number of lower-order bits). N-bit second address bit Add[0:N−1] is supplied to first memory module 41 and second memory module 42. Address separator 61 includes latch circuits which latch first address bit Add[N] and second address bit Add[0:N−1] for timing control.

ECC encoder 21 performs error correction/detection encoding on a data signal Data[0:M] which is write data, and outputs the error correction/detection encoded data to first memory module 41 and second memory module 42. Specifically, ECC encoder 21 generates an s-bit check bit for error correction/detection of (M+1)-bit data signal Data[0:M], and generates an (M+s+1)-bit data signal EData[0:M+s] having the check bit added thereto as the error detection/correction encoded data.

The check bit is a code which can correct an error having less than or equal to X bits, and can detect an error having less than or equal to Y bits (Y>X). For example, the check bit can be an SEC-DED (Single-Error-Correcting Double-Error-Detecting) code, that is, an error correcting code which can correct a 1-bit error and detect a 2-bit error.

Selection decoder 62 controls the level of first selection signal cen1 and the level of second selection signal cen2 based on a selection enabling signal CEN and first address bit Add[N]. When selection enabling signal CEN is "1" which is an activated level and first address bit Add[N] is "1", selection decoder 62 sets the level of first selection signal cen1 to "1" which is an activated level, and sets the level of second selection signal cen2 to "0" which is a deactivated level. When selection enabling signal CEN is "1" which is an activated level and first address bit Add[N] is "0", selection decoder 62 sets the level of first selection signal cen1 to "0" which is a deactivated level, and sets the level of second selection signal cen2 to "1" which is an activated level. When selection enabling signal CEN is "0" which is a deactivated level, selection decoder 62 sets the level of first selection signal cen1 to "0" which is a deactivated level, and sets the level of second selection signal cen2 to "0" which is a deactivated level.

Flash memory 350 stores an address signal C_Add1 indicating a defective memory cell column which exists in normal block 363, and an address signal C_Add2 indicating a defective memory cell column which exists in normal block 365.

Redundant decoder 68 decodes address signal C_Add1 of the defective memory cell column among the plurality of normal memory cell columns in normal block 363, and outputs an address decoding signal R1. Redundant decoder 68 decodes address signal C_Add2 of the defective memory cell column among the plurality of normal memory cell columns in normal block 365, and outputs an address decoding signal R2.

Redundant control circuit 31 provides control such that, during data writing, an output of ECC encoder 21 is written in a redundant memory cell column in redundant block 364, instead of the defective memory cell column in normal block 363, in accordance with address decoding signal R1. For example, when redundant block 364 is arranged on the right side in memory array 43 and a plurality of data input/output lines are connected to a plurality of bit lines of the normal memory cell columns, redundant control circuit 31 provides control such that, during data writing, a data input/output line connected to a bit line of the defective memory cell column and the data input/output lines arranged to the right of the data input/output line are each connected to an adjacent bit line on the right.

Redundant control circuit 32 provides control such that, during data writing, an output of ECC encoder 21 is written in a redundant memory cell column in redundant block 366, instead of the defective memory cell column in normal block 365, in accordance with address decoding signal R2.

In first memory module 41, during data writing, when first selection signal cen1 is "1", error detection/correction encoded data Edata[0:M+s] is written at a place designated by second address bit Add[0:N−1], and when first selection signal cen1 is "0", error detection/correction encoded data Edata[0:M+s] is not written. In second memory module 42, during data writing, when second selection signal cen2 is "1", error detection/correction encoded data Edata[0:M+s] is written at a place designated by second address bit Add[0:N−1], and when second selection signal cen2 is "0", error detection/correction encoded data Edata[0:M+s] is not written.

In first memory module 41, during data reading, when first selection signal cen1 is "1", a stored data signal Q1 is output from the place designated by second address bit Add[0:N−1]. In first memory module 41, during data reading, when first selection signal cen1 is "0", stored data signal Q1 is not output. In second memory module 42, during data reading, when second selection signal cen2 is "1", a stored data signal Q2 is output from the place designated by second address bit Add[0:N−1]. In second memory module 42, during data reading, when second selection signal cen2 is "0", stored data signal Q2 is not output.

Redundant control circuit 33 provides control such that, during data reading, data is read from the redundant memory cell column in redundant block 364, instead of the defective memory cell column in normal block 363, in accordance with address decoding signal R1. For example, when redundant block 364 is arranged on the right side in memory array 43 and the plurality of data input/output lines are connected to the plurality of bit lines of the normal memory cell columns, redundant control circuit 33 provides control such that, during data reading, the data input/output line connected to the bit line of the defective memory cell column and the data input/output lines arranged to the right of the data input/output line are each connected to the adjacent bit line on the right.

Redundant control circuit 34 provides control such that, during data reading, data is read from the redundant memory cell column in redundant block 366, instead of the defective memory cell column in normal block 365, in accordance with address decoding signal R2.

Selector 51 selects any of data signal Q1 output from first memory module 41 and data signal Q2 output from second memory module 42 based on the level of first selection signal cen1 and the level of second selection signal cen2, and outputs the selected data signal to ECC decoder 22.

When the level of first selection signal cen1 is "1" which is an activated level and the level of second selection signal cen2 is "0" which is a deactivated level, selector 51 selects data signal Q1 output from first memory module 41 and outputs data signal Q1 to ECC decoder 22. When the level of first selection signal cen1 is "0" which is a deactivated level and the level of second selection signal cen2 is "1" which is an activated level, selector 51 selects data signal Q2 output from second memory module 42 and outputs data signal Q2 to ECC decoder 22. When the level of first selection signal cen1 is "0" which is a deactivated level and the level of second selection signal cen2 is "0" which is a deactivated level, selector 51 selects and outputs any of data signal Q1 output from first memory module 41 and data signal Q2 output from second memory module 42. When the level of first selection signal cen1 is "1" which is an activated level and the level of second selection signal cen2 is "1" which is an activated level, selector 51 selects and outputs any of data signal Q1 output from first memory module 41 and data signal Q2 output from second memory module 42. Which data signal should be selected when cen1="1" and cen2="1" and when cen1="0" and cen2="0" may be determined by any of selecting the one explicitly predetermined, selecting the one previously selected, selecting the one determined by a logic gate mapped by a logic design, and the like.

ECC decoder 22 performs error detection/correction on an output of selector 51. When ECC decoder 22 detects an error in the output of selector 51, ECC decoder 22 outputs a failure notification signal ERROR. When interrupt control unit 201 receives failure notification signal ERROR, interrupt control unit 201 sends CPU 202 an interrupt notification that a failure is sensed.

CPU 202 controls the entire semiconductor device. When CPU 202 receives the interrupt notification of the failure from interrupt control unit 201, CPU 202 performs necessary processing.

FF 71 is provided at a position partway along a transmission path for first selection signal cen1 from selection decoder 62 to selector 51. FF 72 is provided at a position partway along a transmission path for second selection signal cen2 from selection decoder 62 to selector 51. The same clock is supplied to FF 71, FF 72, first memory module 41, and second memory module 42.

FF 71 is provided to synchronize timing at which first selection signal cen1 is sent to selector 51 with timing at which output Q1 from first memory module 41 is sent to selector 51. FF 72 is provided to synchronize timing at which second selection signal cen2 is sent to selector 51 with timing at which output Q2 from second memory module 42 is sent to selector 51. Such synchronization control is required because time equal to one cycle of clock CLK is required for data output in first memory module 41 and second memory module 42.

Semiconductor device 400 in reference example 1 has a problem that it cannot detect a failure in selection decoder 62 which processes address signal Add[N] and a wire relevant thereto, and a failure in redundant decoder 68 which processes address signals C_Add1 and C_Add2 and a wire relevant thereto.

Second Embodiment

Figure 4:
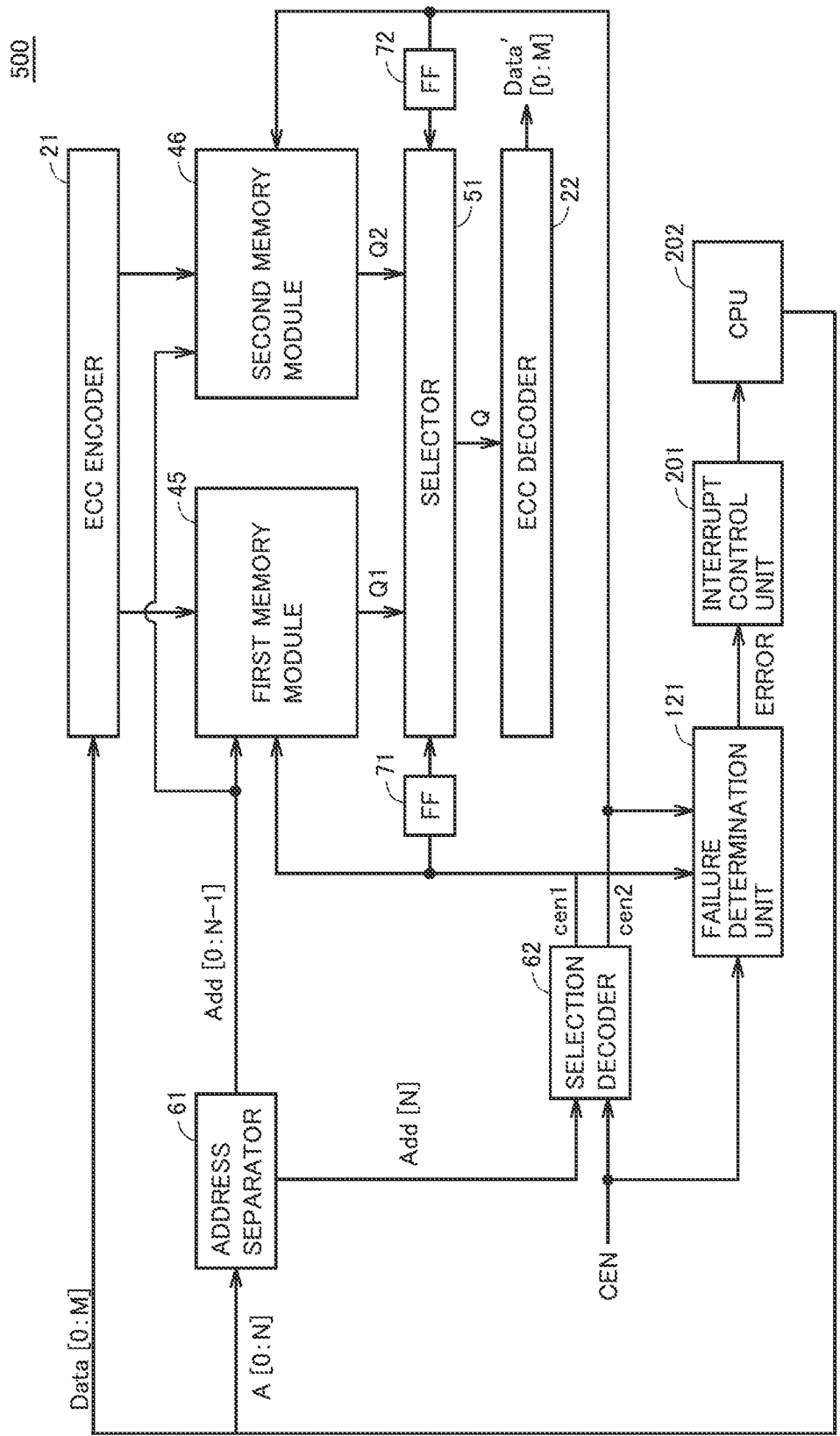
FIG. 4 is a view showing a configuration of a semiconductor device in a second embodiment.

FIG. 4 is a view showing a configuration of a semiconductor device 500 in a second embodiment.

This semiconductor device 500 includes a first memory module 45, a second memory module 46, ECC encoder 21, selector 51, ECC decoder 22, address separator 61, selection decoder 62, a failure determination unit 121, interrupt control unit 201, CPU 202, and FFs 71 and 72.

Since ECC encoder 21, address separator 61, selection decoder 62, ECC decoder 22, FFs 71 and 72, selector 51, interrupt control unit 201, and CPU 202 in the second embodiment are the same as those in reference example 1, description thereof will not be repeated.

First memory module 45 includes a memory array having a plurality of SRAM memory cells, and an SRAM logic circuit, as with first memory module 41 in reference example 1. It is assumed that first memory module 45 does not have a redundant column relief function.

Second memory module 46 includes a memory array having a plurality of SRAM memory cells, and an SRAM logic circuit, as with second memory module 42 in reference example 1. It is assumed that second memory module 46 does not have a redundant column relief function.

Failure determination unit 121 determines whether or not selection decoder 62 has a failure, based on the level of first selection signal cen1, the level of second selection signal cen2, and the level of selection enabling signal CEN. When failure determination unit 121 determines that selection decoder 62 has a failure, failure determination unit 121 outputs failure notification signal ERROR to interrupt control unit 201.

Figures 5, 6:
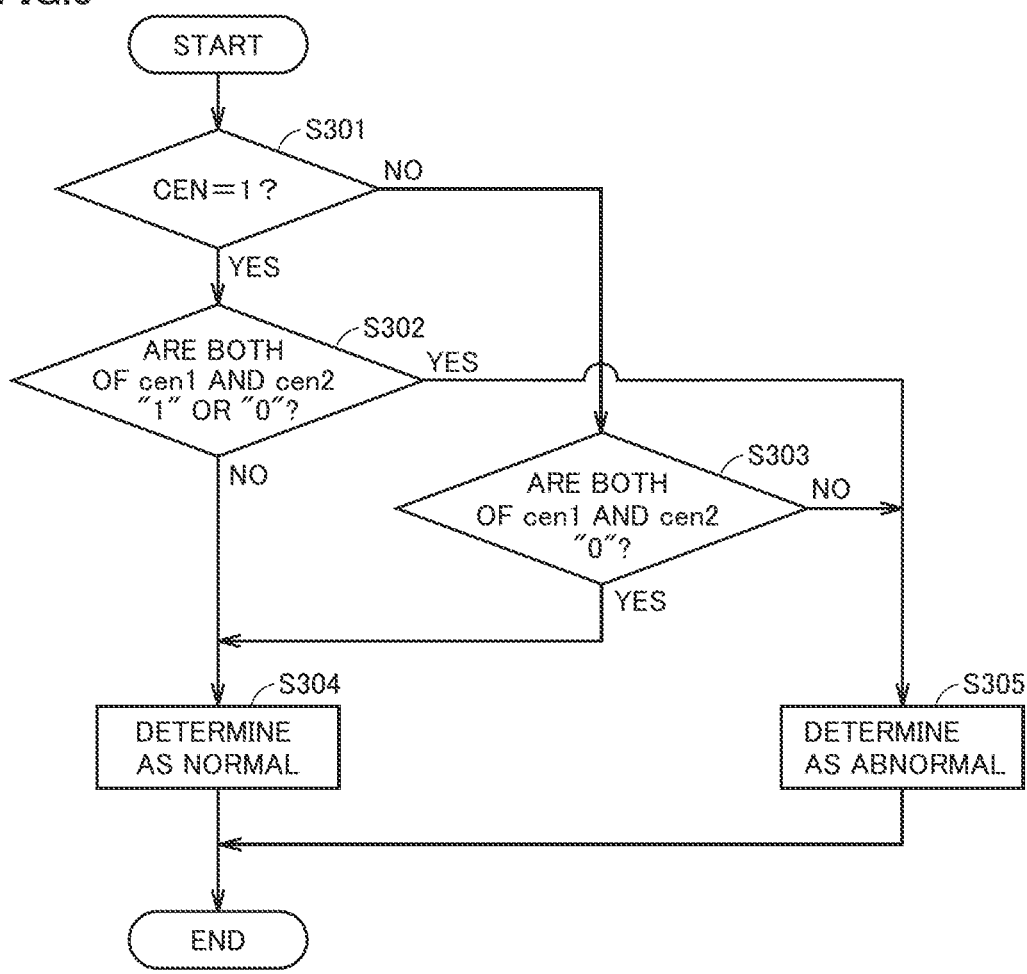
FIG. 5 is a view showing the relation between inputs and outputs when a selection decoder is normal.
FIG. 6 is a flowchart showing a procedure for determining a failure in a selection decoder 62.

FIG. 5 is a view showing the relation between inputs (selection enabling signal CEN, the most significant bit Add[N] of the address signal) and outputs (first selection signal cen1, second selection signal cen2) when selection decoder 62 is normal.

In a case where selection decoder 62 is normal, when the level of selection enabling signal CEN is "1" which is an activated level and the most significant bit Add[N] of the address signal is "1", selection decoder 62 sets the level of first selection signal cen1 to "1" which is an activated level, and sets the level of second selection signal cen2 to "0" which is a deactivated level. In the case where selection decoder 62 is normal, when the level of selection enabling signal CEN is "1" which is an activated level and the most significant bit Add[N] of the address signal is "0", selection decoder 62 sets the level of first selection signal cen1 to "0" which is a deactivated level, and sets the level of second selection signal cen2 to "1" which is an activated level. In the case where selection decoder 62 is normal, when the level of selection enabling signal CEN is "0", selection decoder 62 sets the level of first selection signal cen1 to "0" which is a deactivated level, and sets the level of second selection signal cen2 to "0" which is a deactivated level, irrespective of the level of the most significant bit Add[N] of the address signal.

FIG. 6 is a flowchart showing a procedure for determining a failure in selection decoder 62.

Referring to FIG. 6, in step S301, when the level of selection enabling signal CEN is "1" (YES), the processing proceeds to step S302, and when the level of selection enabling signal CEN is "0" (NO), the processing proceeds to step S303.

In step S302, when both of the level of first selection signal cen1 and the level of second selection signal cen2 are "1" or "0" (YES), the processing proceeds to step S305, and when one of the level of first selection signal cen1 and the level of second selection signal cen2 is "1" and the other thereof is "0" (NO), the processing proceeds to step S304.

In step S303, when both of the level of first selection signal cen1 and the level of second selection signal cen2 are "0" (YES), the processing proceeds to step S304, and when at least one of the level of first selection signal cen1 and the level of second selection signal cen2 is "1" (NO), the processing proceeds to step S305.

In step S304, failure determination unit 121 determines that selection decoder 62 is in a normal state.

In step S305, failure determination unit 121 determines that selection decoder 62 is in a failed state. Failure determination unit 121 outputs failure notification signal ERROR to interrupt control unit 201. When interrupt control unit 201 receives failure notification signal ERROR, interrupt control unit 201 notifies CPU 202 of a failure.

It should be noted that the reason for determining that selection decoder 62 is in a failed state only in the case where only any one of first selection signal cen1 and second selection signal cen2 is reversed when the level of selection enabling signal CEN is "1" in the above description is to detect a single failure which often occurs.

As described above, in the present embodiment, whether or not selection decoder 62 has a failure can be determined based on the level of first selection signal cen1, the level of second selection signal cen2, and the level of selection enabling signal CEN.

Third Embodiment

Figure 7:
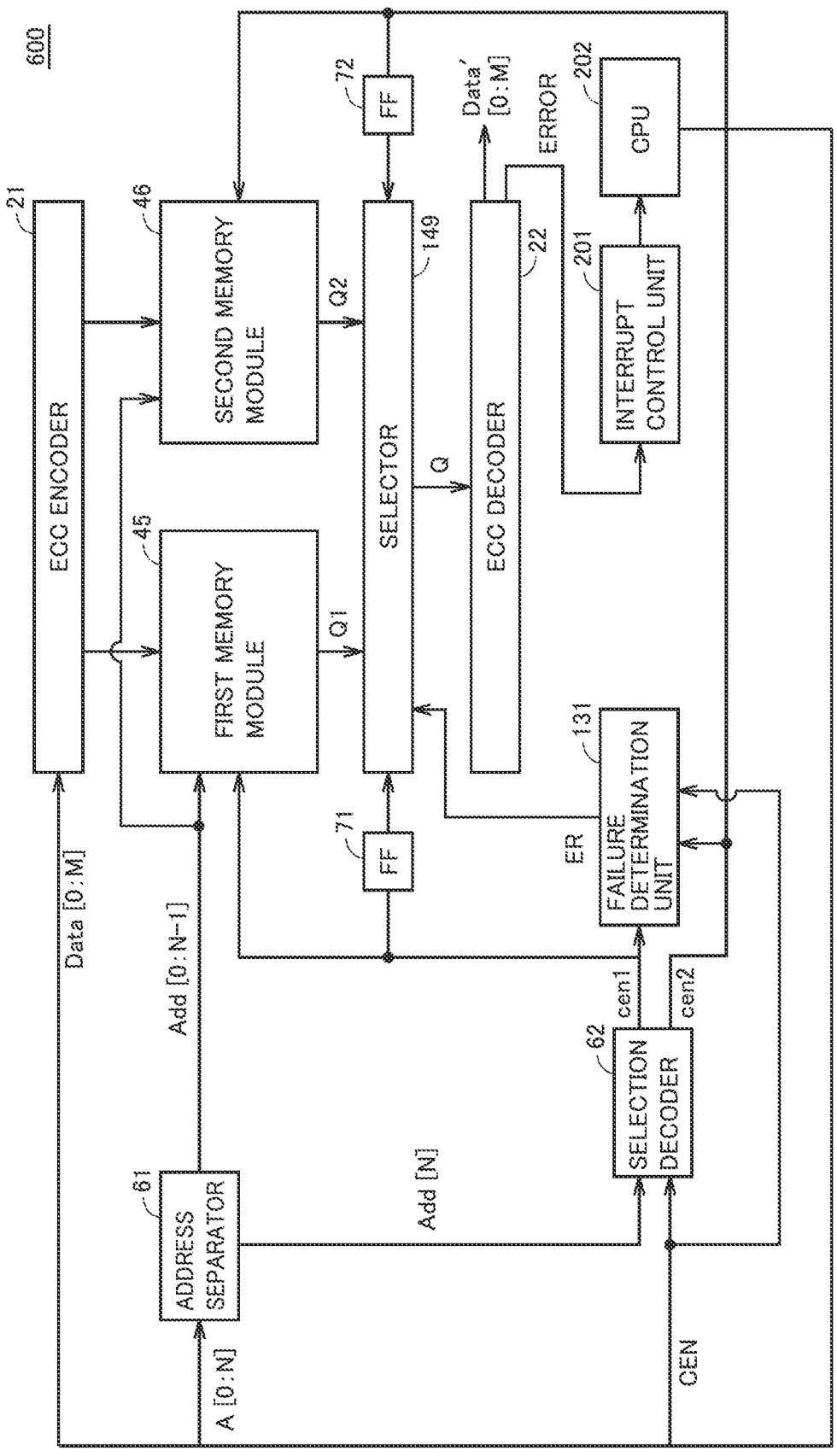
FIG. 7 is a view showing a configuration of a semiconductor device in a third embodiment.

FIG. 7 is a view showing a configuration of a semiconductor device 600 in a third embodiment.

This semiconductor device 600 includes first memory module 45, second memory module 46, ECC encoder 21, a selector 149, ECC decoder 22, address separator 61, selection decoder 62, a failure determination unit 131, interrupt control unit 201, CPU 202, and FFs 71 and 72.

Since first memory module 45, second memory module 46, ECC encoder 21, ECC decoder 22, address separator 61, selection decoder 62, interrupt control unit 201, CPU 202, and FFs 71 and 72 in the third embodiment are the same as those in the second embodiment, description thereof will not be repeated.

Failure determination unit 131 determines whether or not selection decoder 62 has a failure, as with failure determination unit 121 in the second embodiment. When failure determination unit 131 determines that selection decoder 62 has a failure, failure determination unit 131 outputs a failure sensing signal ER to selector 149.

When selector 149 receives failure sensing signal ER, selector 149 reverses X bits of a plurality of bits of data output from selected one of first memory module 45 and second memory module 46. The X bits are the number of bits which is more than an upper limit of the number of bits of an error which can be corrected and less than or equal to an upper limit of the number of bits of an error which can be detected in ECC decoder 22. When the check bit is an SEC-DED code, X is 2.

According to the present embodiment, a failure in selection decoder 62 which processes address signal Add[N] and a wire relevant thereto can be sensed without providing a new circuit.

Fourth Embodiment

Figure 8:
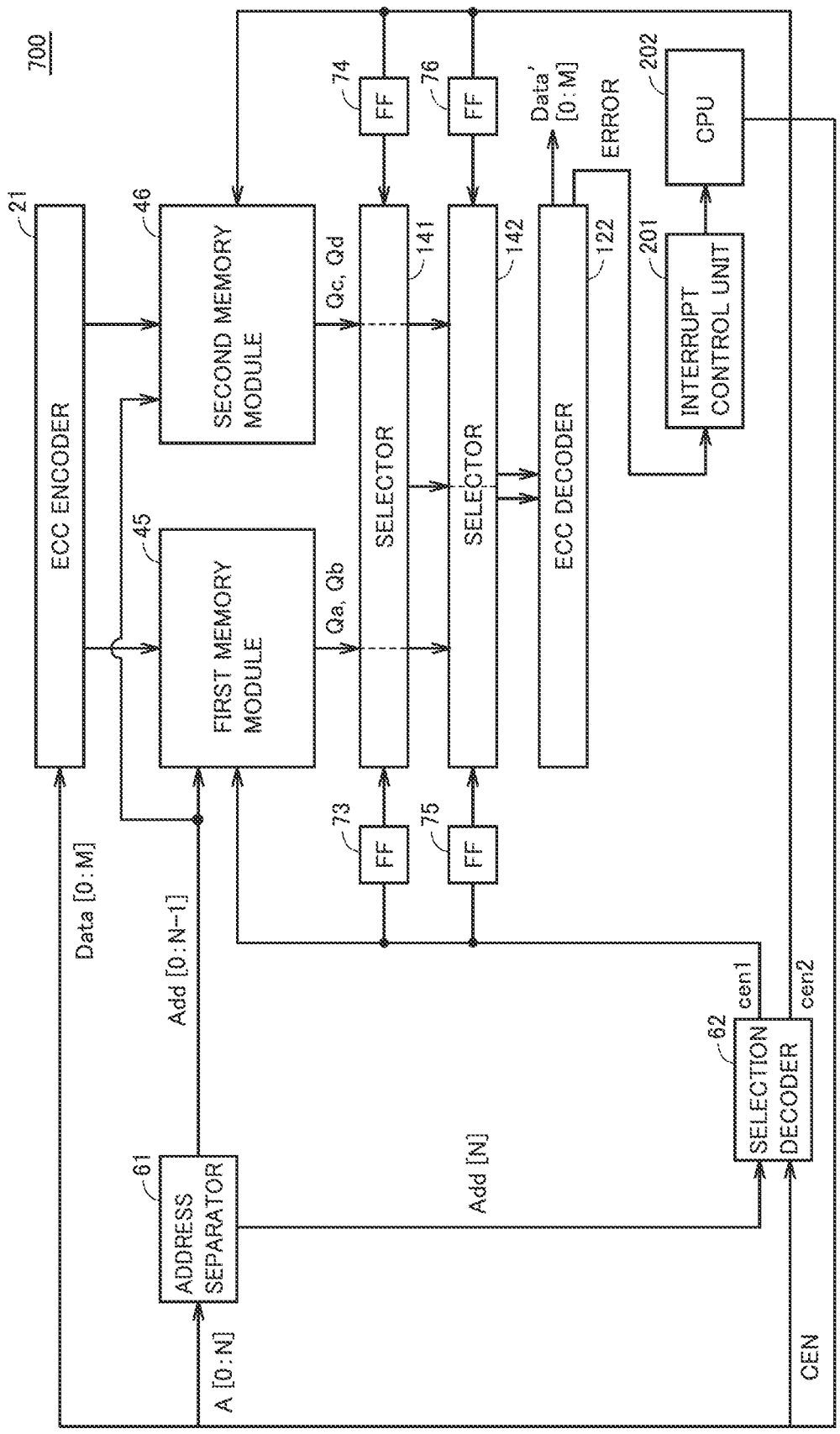
FIG. 8 is a view showing a configuration of a semiconductor device in a fourth embodiment.

FIG. 8 is a view showing a configuration of a semiconductor device 700 in a fourth embodiment.

This semiconductor device 700 includes first memory module 45, second memory module 46, ECC encoder 21, a selector 141, a selector 142, an ECC decoder 122, address separator 61, selection decoder 62, interrupt control unit 201, CPU 202, and FFs 73, 74, 75, and 76.

Since first memory module 45, second memory module 46, ECC encoder 21, address separator 61, selection decoder 62, interrupt control unit 201, and CPU 202 in the fourth embodiment are the same as those in the second embodiment, description thereof will not be repeated.

During data reading, a plurality of bits constituting data to be output from first memory module 45 are classified into a plurality of bits Qa in a group A (first group) and a plurality of bits Qb in a group B (second group). First memory module 45 outputs the plurality of bits Qa in group A to selector 141, and outputs the plurality of bits Qb in group B to selector 142.

During data reading, a plurality of bits constituting data to be output from second memory module 46 are classified into a plurality of bits Qc in a group C (first group) and a plurality of bits Qd in a group D (second group). Second memory module 46 outputs the plurality of bits Qc in group C to selector 141, and outputs the plurality of bits Qd in group D to selector 142.

Positions of the plurality of bits Qa in group A are the same as positions of the plurality of bits Qc in group C. Positions of the plurality of bits Qb in group B are the same as positions of the plurality of bits Qd in group D.

For example, the plurality of bits Qa in group A can be odd bits of the plurality of bits to be output from first memory module 45, and the plurality of bits Qb in group B can be even bits of the plurality of bits to be output from first memory module 45. The plurality of bits Qc in group C can be odd bits of the plurality of bits to be output from second memory module 46, and the plurality of bits Qd in group D can be even bits of the plurality of bits to be output from second memory module 46.

Alternatively, the plurality of bits Qa in group A can be higher-order half bits on an MSB (Most Significant Bit) side, of the plurality of bits to be output from first memory module 45, and the plurality of bits Qb in group B can be lower-order half bits on an LSB (Least Significant Bit) side, of the plurality of bits to be output from first memory module 45. The plurality of bits Qc in group C can be higher-order half bits on the MSB side, of the plurality of bits to be output from second memory module 46, and the plurality of bits Qd in group D can be lower-order half bits on the LSB side, of the plurality of bits to be output from second memory module 46.

When the level of first selection signal cen1 is "1" and the level of second selection signal cen2 is "0", selector 141 selects the plurality of bits Qa in group A, of the plurality of bits Qa in group A output from first memory module 45 and the plurality of bits Qc in group C output from second memory module 46, and outputs the plurality of bits Qa in group A to ECC decoder 122.

When the level of first selection signal cen1 is "0" and the level of second selection signal cen2 is "1", selector 141 selects the plurality of bits Qc in group C, of the plurality of bits Qa in group A output from first memory module 45 and the plurality of bits Qc in group C output from second memory module 46, and outputs the plurality of bits Qc in group C to ECC decoder 122.

When the level of first selection signal cen1 is "0" and the level of second selection signal cen2 is "0", selector 141 outputs any of the plurality of bits Qa in group A output from first memory module 45 and the plurality of bits Qc in group C output from second memory module 46.

When the level of first selection signal cen1 is "1" and the level of second selection signal cen2 is "1", selector 141 outputs any of the plurality of bits Qa in group A output from first memory module 45 and the plurality of bits Qc in group C output from second memory module 46.

When the level of first selection signal cen1 is "1" and the level of second selection signal cen2 is "0", selector 142 selects the plurality of bits Qb in group B, of the plurality of bits Qb in group B output from first memory module 45 and the plurality of bits Qd in group D output from second memory module 46, and outputs the plurality of bits Qb in group B to ECC decoder 122.

When the level of first selection signal cen1 is "0" and the level of second selection signal cen2 is "1", selector 142 selects the plurality of bits Qd in group D, of the plurality of bits Qb in group B output from first memory module 45 and the plurality of bits Qd in group D output from second memory module 46, and outputs the plurality of bits Qd in group D to ECC decoder 122.

When the level of first selection signal cen1 is "0" and the level of second selection signal cen2 is "0", selector 142 outputs any of the plurality of bits Qb in group B output from first memory module 45 and the plurality of bits Qd in group D output from second memory module 46.

When the level of first selection signal cen1 is "1" and the level of second selection signal cen2 is "1", selector 142 outputs any of the plurality of bits Qb in group B output from first memory module 45 and the plurality of bits Qd in group D output from second memory module 46.

ECC decoder 122 performs error detection/correction on bits obtained by synthesizing an output of selector 141 and an output of selector 142. When ECC decoder 122 detects an error in the synthesized bits, ECC decoder 122 outputs failure notification signal ERROR.

FF 73 is provided at a position partway along a transmission path for first selection signal cen1 from selection decoder 62 to selector 141. FF 74 is provided at a position partway along a transmission path for second selection signal cen2 from selection decoder 62 to selector 141. FF 75 is provided at a position partway along a transmission path for first selection signal cen1 from selection decoder 62 to selector 142. FF 76 is provided at a position partway along a transmission path for second selection signal cen2 from selection decoder 62 to selector 142. The same clock is supplied to FF 73, FF 74, FF 75, FF 76, first memory module 41, and second memory module 42.

With the above configuration, a failure in FF 73, FF 74, FF 75, or FF 76 can be detected.

For example, in the case of cen1=1 and cen2=0, when FF 73 is normal, selector 141 outputs the plurality of bits Qa in group A. However, when FF 73 has a failure, it is uncertain whether selector 141 outputs the plurality of bits Qa in group A or the plurality of bits Qc in group C. When the plurality of bits Qc in group C are output, ECC decoder 122 performs error detection/correction on bits obtained by synthesizing the plurality of bits Qb in group B and the plurality of bits Qc in group C, and thereby detects an error. Thus, a failure in any of FF 73 to FF 76 can be detected.

Fifth Embodiment

Figure 9:
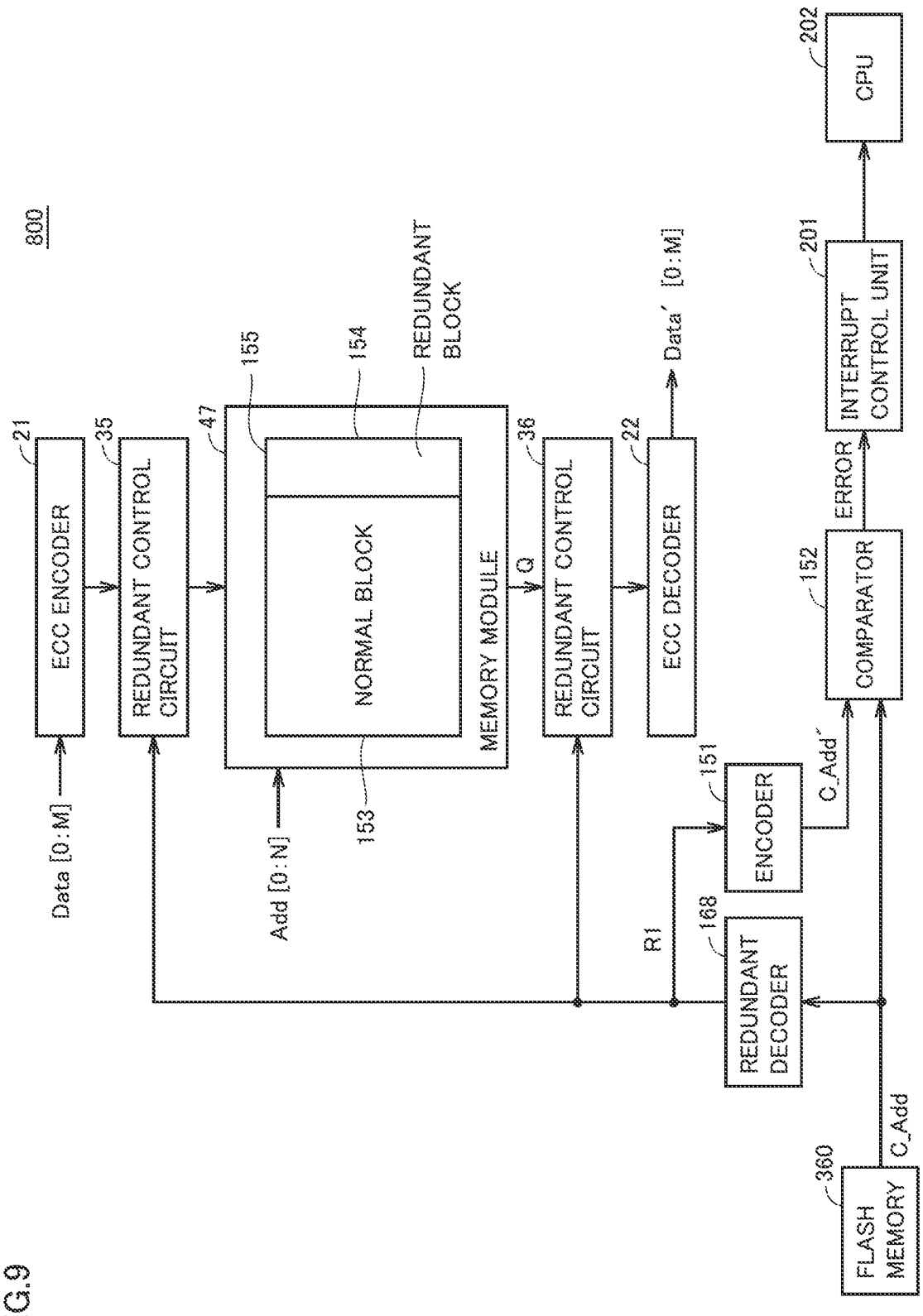
FIG. 9 is a view showing a configuration of a semiconductor device in a fifth embodiment.

FIG. 9 is a view showing a configuration of a semiconductor device 800 in a fifth embodiment.

Referring to FIG. 9, this semiconductor device 800 includes a memory module 47, ECC encoder 21, redundant control circuits 35 and 36, ECC decoder 22, a redundant decoder 168, an encoder 151, a comparator 152, interrupt control unit 201, and CPU 202.

Since ECC encoder 21, ECC decoder 22, interrupt control unit 201, and CPU 202 are the same as those in reference example 1, description thereof will not be repeated.

Memory module 47 includes a memory array 155 having a plurality of SRAM memory cells, and an SRAM logic circuit.

Memory array 155 includes a normal block 153 and a redundant block 154. Normal block 153 is composed of a plurality of normal memory cell columns. The plurality of normal memory cell columns serve as a place where data is to be written, unless they are defective. Redundant block 154 is composed of one or more redundant memory cell columns. The one or more redundant memory cell columns are provided to relieve a defective memory cell column having a defective memory cell, among the plurality of normal memory cell columns included in normal block 153. The one or more redundant memory cell columns serve as a place where data is to be written, instead of the defective memory cell column.

Redundant decoder 168 decodes an address signal C_Add of the defective memory cell column among the plurality of normal memory cell columns in normal block 153, and outputs address decoding signal R1.

Redundant control circuit 35 provides control such that, during data writing, an output of ECC encoder 21 is written in a redundant memory cell column in redundant block 154, instead of the defective memory cell column in normal block 153, in accordance with address decoding signal R1.

In memory module 47, during data writing, error detection/correction encoded data Edata[0:M+s] is written at a place designated by address signal Add[0:N].

In memory module 47, during data reading, a stored data signal Q is output from the place designated by address signal Add[0:N].

Redundant control circuit 36 provides control such that data is read from the redundant memory cell column in redundant block 154, instead of the defective memory cell column in normal block 153, in accordance with address decoding signal R1.

Encoder 151 encodes address decoding signal R1, and outputs an address signal C_Add' of the defective memory cell column among the plurality of normal memory cell columns in normal block 153. This encoding is reverse conversion of the decoding (conversion) by redundant decoder 168.

Comparator 152 compares address signal C_Add' output from encoder 151 with address signal C_Add to be input to redundant decoder 168, and outputs failure notification signal ERROR when mismatch occurs.

With the above configuration, when redundant decoder 168 is in a failed state, address decoding signal R1 generated from address signal C_Add becomes an erroneous signal, and address signal C_Add' obtained by encoding address decoding signal R1 is different from address signal C_Add. By detecting this difference, a failure in redundant decoder 168 can be determined.

Sixth Embodiment

Figure 10:
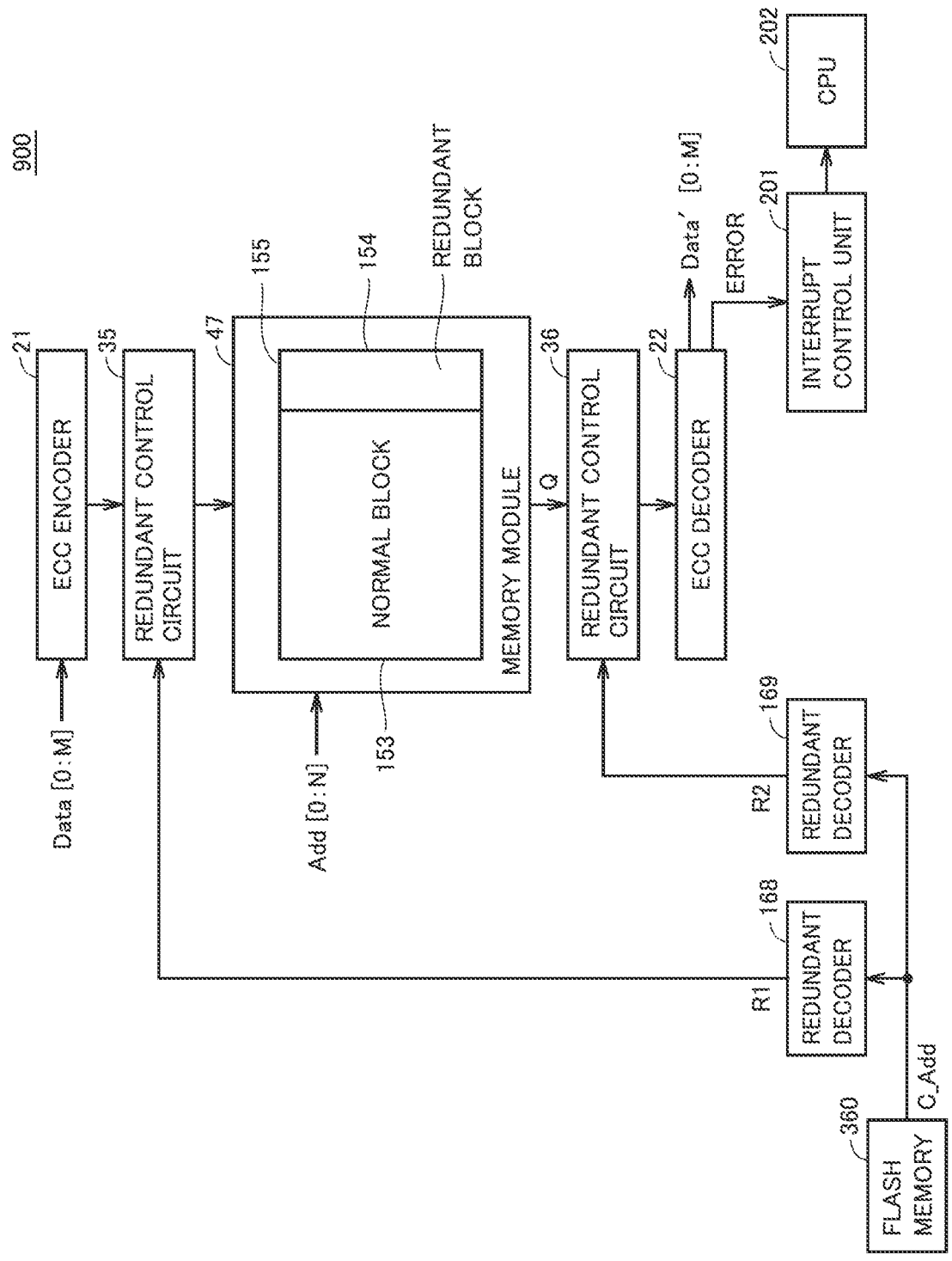
FIG. 10 is a view showing a configuration of a semiconductor device in a sixth embodiment.

FIG. 10 is a view showing a configuration of a semiconductor device 900 in a sixth embodiment.

Referring to FIG. 10, this semiconductor device 900 includes memory module 47, ECC encoder 21, redundant control circuits 35 and 36, ECC decoder 22, redundant decoders 168 and 169, interrupt control unit 201, and CPU 202.

Since memory module 47, ECC encoder 21, interrupt control unit 201, and CPU 202 are the same as those in the fifth embodiment, description thereof will not be repeated.

During data writing, redundant decoder 168 decodes address signal C_Add of the defective memory cell column among the plurality of normal memory cell columns in normal block 153, and outputs address decoding signal R1.

Redundant control circuit 35 provides control such that, during data writing, an output of ECC encoder 21 is written in a redundant memory cell column in redundant block 154, instead of the defective memory cell column in normal block 153, in accordance with address decoding signal R1.

During data reading, redundant decoder 169 decodes address signal C_Add of the defective memory cell column among the plurality of normal memory cell columns in normal block 153, and outputs address decoding signal R2.

Redundant control circuit 36 provides control such that, during data reading, data is read from the redundant memory cell column in redundant block 154, instead of the defective memory cell column in normal block 153, in accordance with address decoding signal R2.

ECC decoder 22 performs error detection/correction on an output from memory module 47 controlled by redundant control circuit 36 to be read. When ECC decoder 22 detects an error in the output of memory module 47, ECC decoder 22 outputs failure notification signal ERROR. When address decoding signal R1 is different from address decoding signal R2 because at least one of redundant decoder 168 and redundant decoder 169 is in a failed state, ECC decoder 22 detects the error in the output of memory module 47. When interrupt control unit 201 receives failure notification signal ERROR, interrupt control unit 201 sends CPU 202 an interrupt notification that a failure is sensed.

Seventh Embodiment

Figure 11:
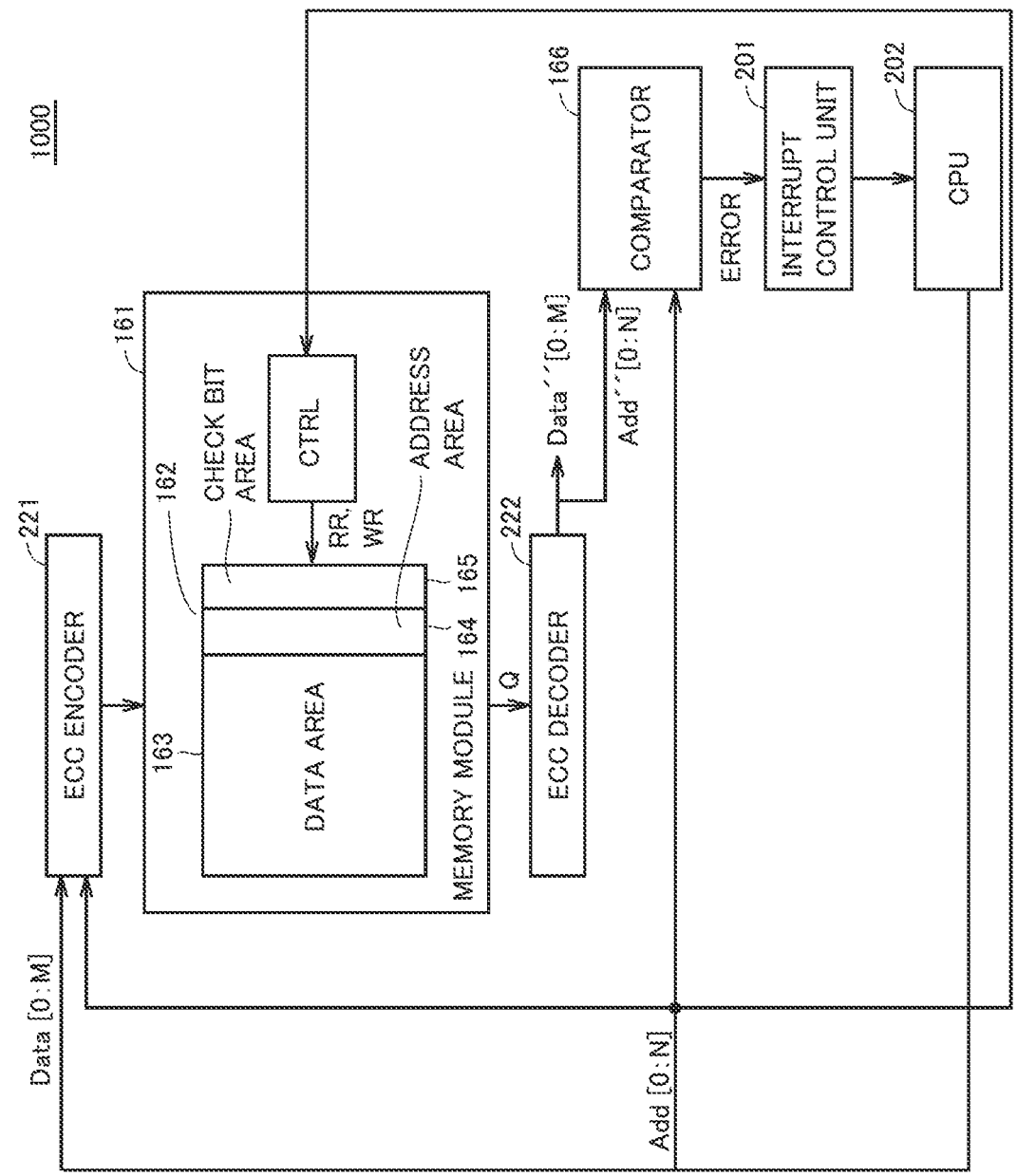
FIG. 11 is a view showing a configuration of a semiconductor device in a seventh embodiment.

FIG. 11 is a view showing a configuration of a semiconductor device 1000 in a seventh embodiment.

Referring to FIG. 11, this semiconductor device 1000 includes a memory module 161, an ECC encoder 221, an ECC decoder 222, a comparator 166, interrupt control unit 201, and CPU 202.

Since interrupt control unit 201 and CPU 202 are the same as those in reference example 1, description thereof will not be repeated.

Memory module 161 includes a memory array 162 including a plurality of SRAM cells, and an SRAM logic such as control unit CTRL.

Memory array 162 includes a data area 163 which stores data signal Data[0:M], an address area 164 which stores address signal Add[0:N], and a check bit area 165 which stores a check bit generated based on data signal Data[0:M]

and address signal Add[0:N]. Data area 163 is composed of (M+1) columns. Address area 164 is composed of (N+1) columns. Check bit area 165 is composed of S columns.

Figure 12:
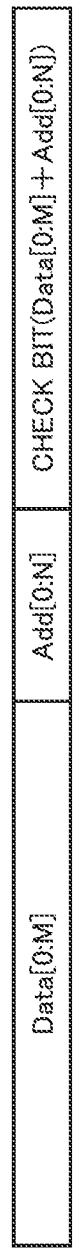
FIG. 12 is a view showing a configuration of data stored in a memory array in the seventh embodiment.

FIG. 12 is a view showing a configuration of data stored in memory array 162 in the seventh embodiment.

In one row of memory array 162, a bit sequence including (M+1)-bit data signal Data[0:M], (N+1)-bit address signal Add[0:N], and the S-bit check bit is stored.

During data writing to memory array 162, control unit CTRL including temporary storage circuit 650 and address decoder ADRCTL as shown in FIG. 3 decodes an address signal Add[0:N] for writing, and outputs a first address decoding signal WR.

During data writing, ECC encoder 221 performs error detection/correction encoding on a bit sequence including data signal Data[0:M] and address signal Add[0:N] for writing, and generates the S-bit check bit.

A bit sequence including data signal Data[0:M], address signal Add[0:N] for writing, and the check bit output from ECC encoder 221 is written at a position of a row designated by first address decoding signal WR in memory array 162.

During data reading from memory array 162, control unit CTRL decodes an address signal Add[0:N] for reading, and outputs a second address decoding signal RR.

During data reading, memory array 162 outputs a bit sequence including data Data'[0:M], an address Add'[0:N], and a check bit, from a position of a row designated by second address decoding signal RR.

ECC decoder 222 performs error detection/correction decoding on the bit sequence output from memory module 161, and outputs data Data"[0:M] and an address Add"[0:N].

Comparator 166 compares address Add"[0:N] output from ECC decoder 222 with address signal Add[0:N] for reading. Comparator 166 outputs failure notification signal ERROR when mismatch occurs.

When control unit CTRL has no failure, address Add"[0:N] output from ECC decoder 222 matches address signal Add[0:N] for reading. There may be a case where, due to occurrence of a failure in control unit CTRL, first address decoding signal WR obtained by decoding the address for writing is different from second address decoding signal RR obtained by decoding the address for reading which is the same as the address for writing. In such a case, address Add"[0:N] output from ECC decoder 222 does not match address signal Add[0:N] for reading. By detecting this mismatch, a failure in control unit CTRL can be detected.

Eighth Embodiment

Figure 13:
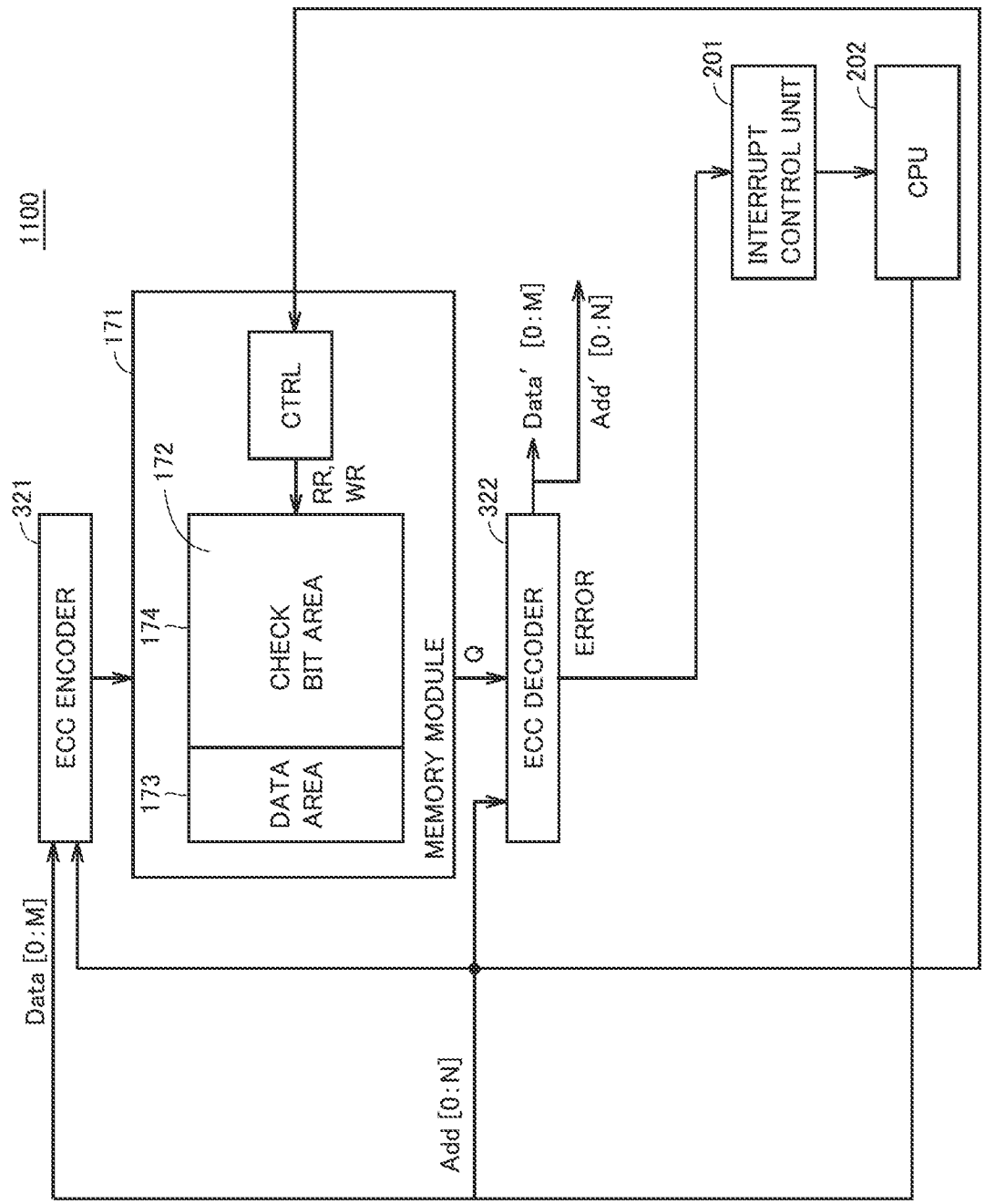
FIG. 13 is a view showing a configuration of a semiconductor device in an eighth embodiment.

FIG. 13 is a view showing a configuration of a semiconductor device 1100 in an eighth embodiment.

Referring to FIG. 13, this semiconductor device 1100 includes a memory module 171, an ECC encoder 321, an ECC decoder 322, interrupt control unit 201, and CPU 202.

Since interrupt control unit 201 and CPU 202 are the same as those in reference example 1, description thereof will not be repeated.

Memory module 171 includes a memory array 172 including a plurality of SRAM cells, and an SRAM logic such as control unit CTRL.

Memory array 172 includes a data area 173 which stores data signal Data[0:M], and a check bit area 174 which stores a check bit generated based on data signal Data[0:M] and address signal Add[0:N]. Data area 173 is composed of (M+1) columns. Check bit area 174 is composed of S columns.

Figure 14:
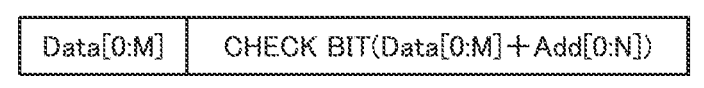

FIG. 14 is a view showing a configuration of data stored in memory array 172 in the eighth embodiment.

In one row of memory array 172, a bit sequence including (M+1)-bit data signal Data[0:M] and the S-bit check bit is stored.

During data writing to memory array 172, control unit CTRL including temporary storage circuit 650 and address decoder ADRCTL as shown in FIG. 3 decodes address signal Add[0:N] for writing, and outputs first address decoding signal WR.

During data writing, ECC encoder 321 performs error detection/correction encoding on a bit sequence including data signal Data[0:M] and address signal Add[0:N] for writing, and generates the S-bit check bit.

A bit sequence including data Data[0:M] and the check bit output from ECC encoder 321 is written at a position of a row designated by first address decoding signal WR in memory array 172.

During data reading from memory array 172, control unit CTRL decodes address signal Add[0:N] for reading, and outputs second address decoding signal RR.

During data reading, memory array 172 outputs a bit sequence including data Data'[0:M] and a check bit, from a position of a row designated by second address decoding signal RR.

ECC decoder 322 adds address signal Add[0:N] for reading to the bit sequence output from memory module 171, and generates a bit sequence including data Data'[0:M], address Add[0:N], and the check bit. ECC decoder 322 performs error detection/correction decoding on the generated bit sequence, and outputs data Data"[0:M] and address Add"[0:N]. When ECC decoder 322 detects an error, ECC decoder 322 outputs failure notification signal ERROR to interrupt control unit 201.

When control unit CTRL has no failure, ECC decoder 322 does not detect an error.

There may be a case where, due to occurrence of a failure in control unit CTRL, first address decoding signal WR obtained by decoding the address for writing is different from second address decoding signal RR obtained by decoding the address for reading which is the same as the address for writing. In such a case, the check bit read from memory module 171 to be input to ECC decoder 322 is different from the one generated from address signal Add[0:N] for reading to be input to ECC decoder 322. Thus, ECC decoder 322 can detect an error based on the check bits.

Reference Example 2

Figure 15:
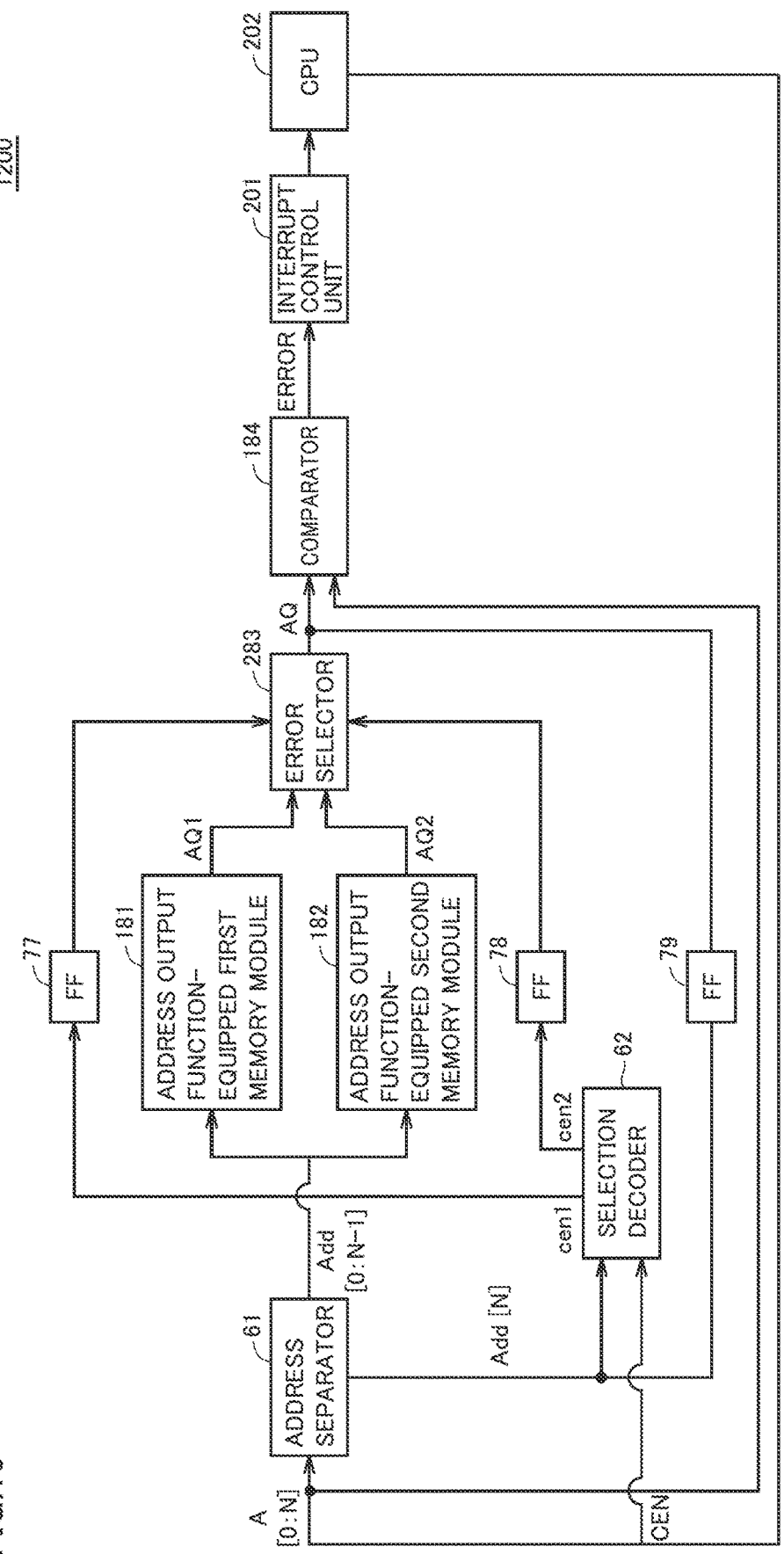
FIG. 15 is a view showing a configuration of a semiconductor device in a reference example 2.

FIG. 15 is a view showing a configuration of a semiconductor device 1200 in a reference example 2. In FIG. 15, a circuit and a wire for processing data signal Data[0:M] are omitted.

Referring to FIG. 15, this semiconductor device 1200 includes an address output function-equipped first memory module 181, an address output function-equipped second memory module 182, address separator 61, selection decoder 62, an ERROR selector 283, FFs 77, 78, and 79, a comparator 184, interrupt control unit 201, and CPU 202.

Since address separator 61, selection decoder 62, interrupt control unit 201, and CPU 202 are the same as those in reference example 1, description thereof will not be repeated.

Address output function-equipped first memory module 181 includes a memory array having a plurality of SRAM memory cells, and an SRAM logic circuit, as with first memory module 45 in the second embodiment.

N-bit second address bit Add[0:N−1] output from address separator 61 is input to each of address output function-equipped first memory module 181 and address output function-equipped second memory module 182.

Figure 16:
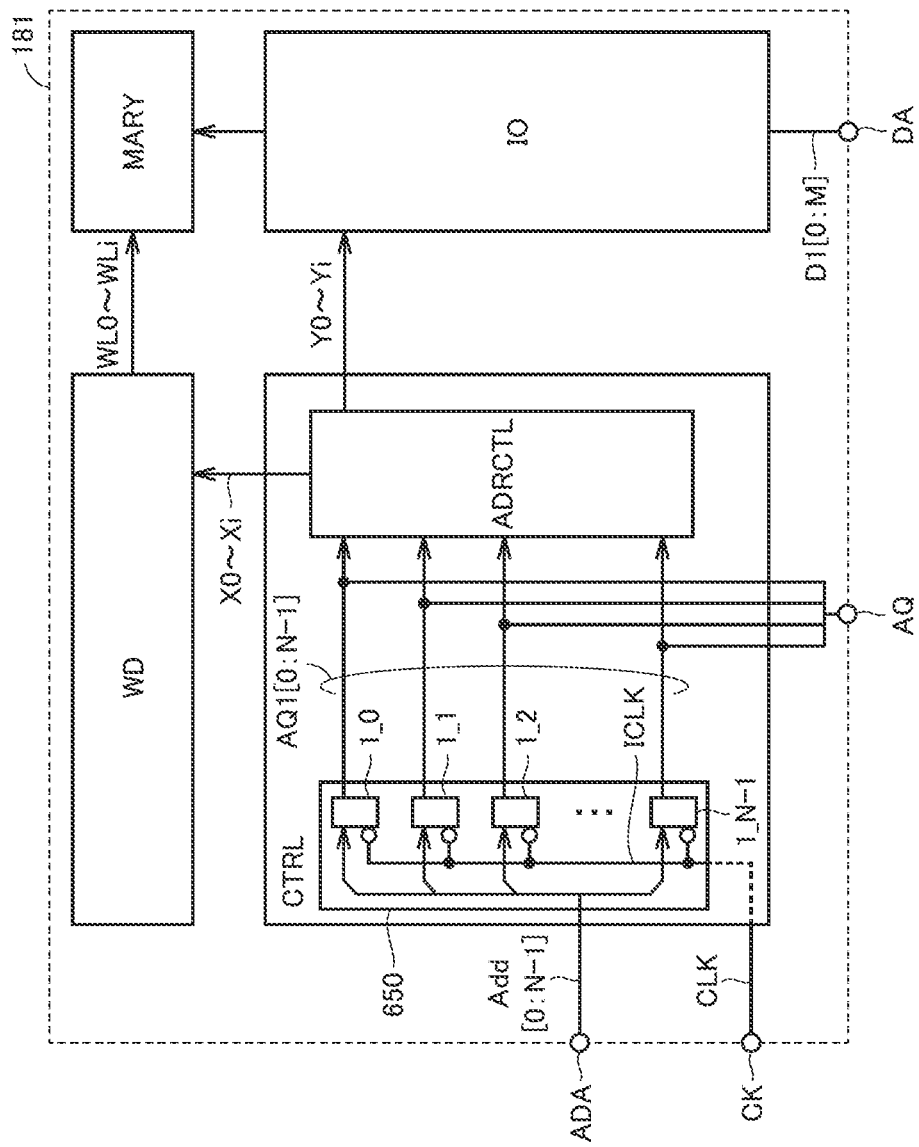
FIG. 16 is a view showing a configuration of an address output function-equipped first memory module.

FIG. 16 is a view showing a configuration of address output function-equipped first memory module 181. The configuration of address output function-equipped second memory module 182 is also the same as this configuration.

Referring to FIG. 16, address output function-equipped first memory module 181 is different from first memory module 41 in FIG. 3 in that address output function-equipped first memory module 181 further has an internal address output terminal AQ for outputting internal address bits AQ1[0] to AQ1[N−1] (hereinafter may be referred to as AQ1). Address output function-equipped first memory module 181 outputs internal address bits AQ1[0] to AQ1[N−1] generated from input N-bit second address bit Add[0:N−1], from internal address output terminal AQ.

Address output function-equipped second memory module 182 outputs internal address bits AQ2[0] to AQ2[N−1] (hereinafter may be referred to as AQ2) generated from input N-bit second address bit Add[0:N−1], from internal address output terminal AQ.

In address output function-equipped first memory module 181, during data writing, when first selection signal cen1 is "1", data signal Data[0:M] is written at a place designated by second address bit Add[0:N−1], and when first selection signal cen1 is "0", data signal Data[0:M] is not written. In address output function-equipped first memory module 181, during data reading, when first selection signal cen1 is "1", stored data signal Q1 is output from the place designated by second address bit Add[0:N−1]. In address output function-equipped first memory module 181, during data reading, when first selection signal cen1 is "0", stored data signal Q1 is not output. Address output function-equipped first memory module 181 outputs internal address bits AQ1[0] to AQ1[N−1], irrespective of the level of first selection signal cen1.

In address output function-equipped second memory module 182, during data writing, when second selection signal cen2 is "1", data signal Data[0:M] is written at a place designated by second address bit Add[0:N−1], and when second selection signal cen2 is "0", data signal Data[0:M] is not written. In address output function-equipped second memory module 182, during data reading, when second selection signal cen2 is "1", stored data signal Q2 is output from the place designated by second address bit Add[0:N−1]. In address output function-equipped second memory module 182, during data reading, when second selection signal cen2 is "0", stored data signal Q2 is not output. Address output function-equipped second memory module 182 outputs internal address bits AQ2[0] to AQ2[N−1], irrespective of the level of second selection signal cen2.

Referring to FIG. 15 again, an ERROR selector 283 selects any of internal address bit AQ1 output from first memory module 181 and internal address bit AQ2 output from second memory module 182 based on the level of first selection signal cen1 and the level of second selection signal cen2, and outputs the selected internal address bit to comparator 184.

When the level of first selection signal cen1 is "1" which is an activated level and the level of second selection signal cen2 is "0" which is a deactivated level, ERROR selector 283 selects internal address bit AQ1 output from first memory module 181 and outputs internal address bit AQ1 to comparator 184. When the level of first selection signal cen1 is "0" which is a deactivated level and the level of second selection signal cen2 is "1" which is an activated level, ERROR selector 283 selects internal address bit AQ2 output from second memory module 182 and outputs internal address bit AQ2 to comparator 184. When the level of first selection signal cen1 is "0" and the level of second selection signal cen2 is "0", ERROR selector 283 outputs any of internal address bit AQ1 output from first memory module 181 and internal address bit AQ2 output from second memory module 182. When the level of first selection signal cen1 is "1" and the level of second selection signal cen2 is "1", ERROR selector 283 outputs any of internal address bit AQ1 output from first memory module 181 and internal address bit AQ2 output from second memory module 182.

Comparator 184 compares bits obtained by synthesizing internal address bit AQ1 or AQ2 output from ERROR selector 283 and first address bit Add[N] output from address separator 61, with address signal A[0:N] output from CPU 202. Comparator 184 outputs failure notification signal ERROR when mismatch occurs.

FF 77 is provided at a position partway along a transmission path for first selection signal cen1 from selection decoder 62 to ERROR selector 283. FF 78 is provided at a position partway along a transmission path for second selection signal cen2 from selection decoder 62 to ERROR selector 283. FF 79 is provided at a position partway along a transmission path for first address bit Add[N] from address separator 61 to an input of comparator 184.

The same clock is supplied to FF 77, FF 78, FF 79, address output function-equipped first memory module 181, and address output function-equipped second memory module 182.

Semiconductor device 1200 in reference example 2 has a problem that it cannot detect a failure in selection decoder 62 which processes address signal A[0:N] and a wire relevant thereto.

This is because, even when at least one of the level of first selection signal cen1 and the level of second selection signal cen2 is erroneous, any of output AQ1 of first memory module 181 and output AQ2 of second memory module 182 is input to comparator 184 via ERROR selector 283.

Ninth Embodiment

Figure 17:
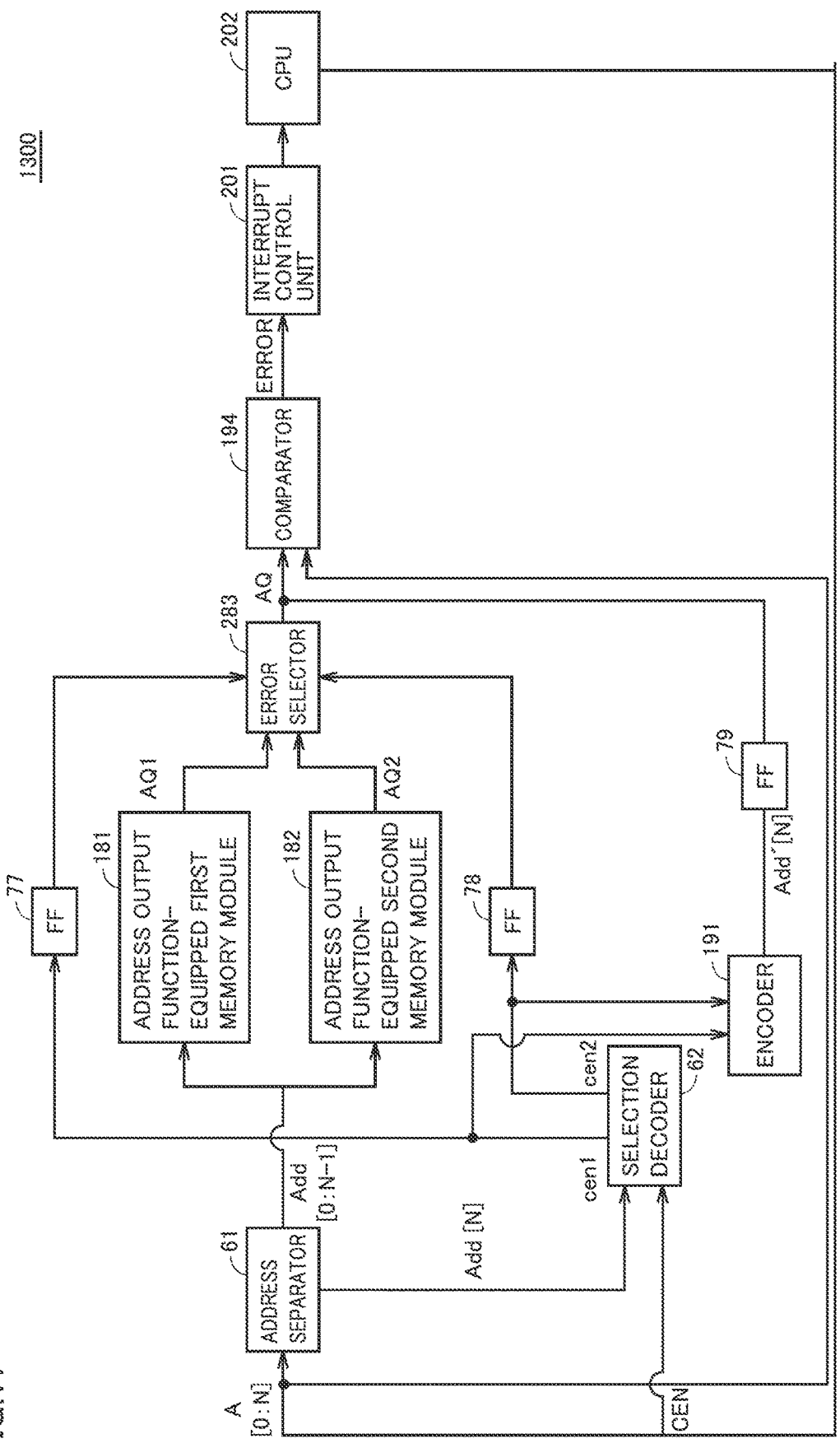
FIG. 17 is a view showing a configuration of a semiconductor device in a ninth embodiment.

FIG. 17 is a view showing a configuration of a semiconductor device 1300 in a ninth embodiment.

Referring to FIG. 17, this semiconductor device 1300 includes address output function-equipped first memory module 181, address output function-equipped second memory module 182, address separator 61, selection decoder 62, ERROR selector 283, FFs 77, 78, and 79, an encoder 191, a comparator 194, interrupt control unit 201, and CPU 202.

Since address output function-equipped first memory module 181, address output function-equipped second memory module 182, address separator 61, selection decoder 62, ERROR selector 283, FFs 77, 78, and 79, interrupt control unit 201, and CPU 202 are the same as those in reference example 2, description thereof will not be repeated.

Encoder 191 encodes first selection signal cen1 and second selection signal cen2 output from selection decoder 62, and outputs a first address bit Add'[N]. This encoding is reverse conversion of the decoding (conversion) by selection decoder 62 when selection enabling signal CEN is "1".

When first selection signal cen1 is "1" and second selection signal cen2 is "0", encoder 191 outputs first address bit Add'[N] (="1"). When first selection signal cen1 is "0" and second selection signal cen2 is "1", encoder 191 outputs first address bit Add'[N] (="0").

Comparator 194 compares bits obtained by synthesizing internal address bit AQ1 or AQ2 output from ERROR selector 283 and first address bit Add'[N] output from encoder 191, with address signal A[0:N] output from CPU 202. Comparator 194 outputs failure notification signal ERROR when mismatch occurs.

When the level of first selection signal cen1 and the level of second selection signal cen2 output from selection decoder 62 are both reversed due to a failure in selection decoder 62, first address bit Add'[N] output from encoder 191 is different from address bit Add[N]. By detecting this difference, a failure in selection decoder 62 can be determined.

Tenth Embodiment

Figure 18:
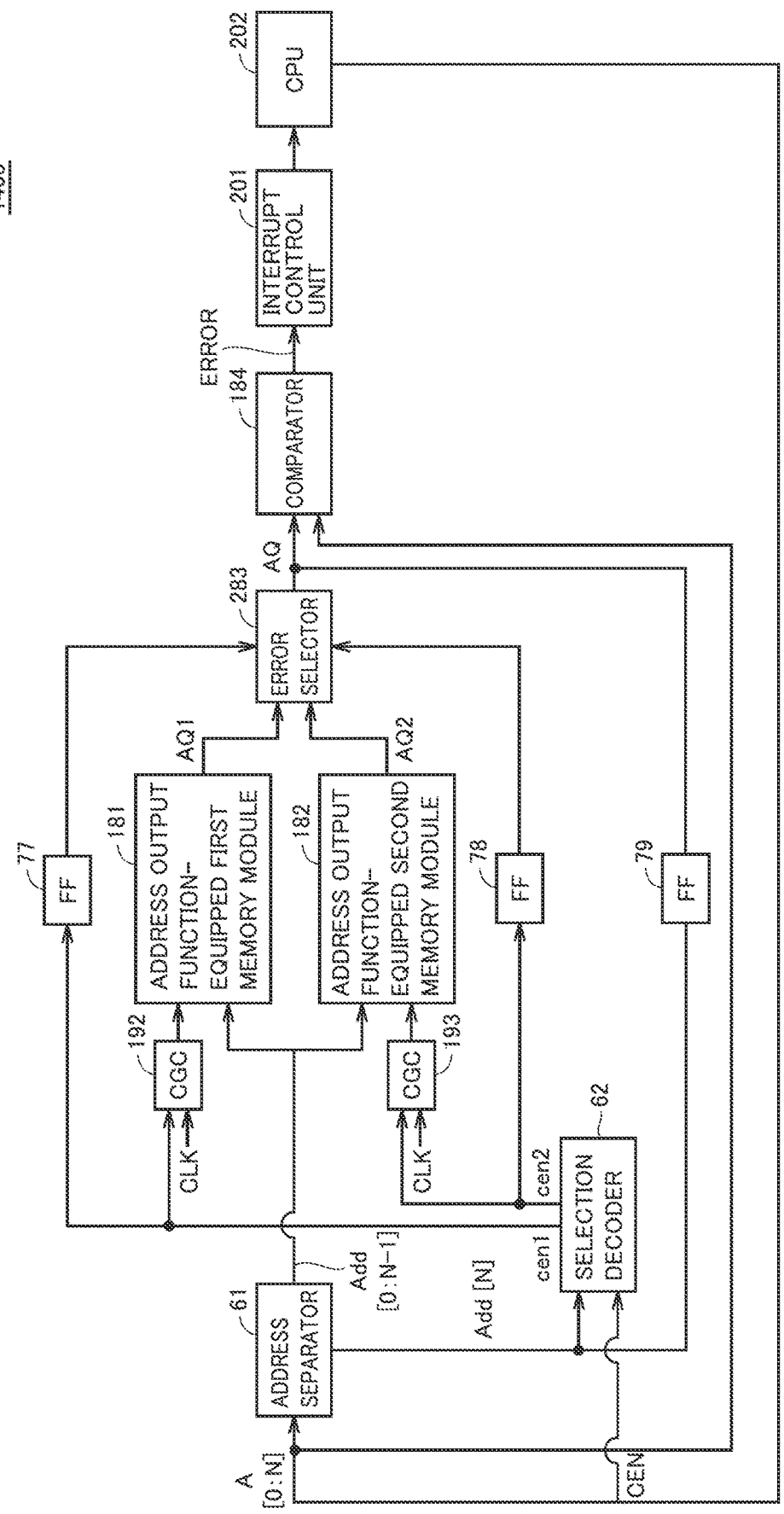
FIG. 18 is a view showing a configuration of a semiconductor device in a tenth embodiment.

FIG. 18 is a view showing a configuration of a semiconductor device 1400 in a tenth embodiment.

Referring to FIG. 18, this semiconductor device 1400 includes address output function-equipped first memory module 181, address output function-equipped second memory module 182, address separator 61, selection decoder 62, and ERROR selector 283. Semiconductor device 1400 includes FFs 77, 78, and 79, CGCs (Clock Gating Circuits) 192 and 193, comparator 184, interrupt control unit 201, and CPU 202.

Since address output function-equipped first memory module 181, address output function-equipped second memory module 182, address separator 61, selection decoder 62, ERROR selector 283, FFs 77, 78, and 79, comparator 184, interrupt control unit 201, and CPU 202 are the same as those in reference example 2, description thereof will not be repeated.

When first selection signal cen1 is "1" which is an activated level, CGC 192 outputs clock CLK to first memory module 181. When second selection signal cen2 is "1" which is an activated level, CGC 193 outputs clock CLK to second memory module 182.

First memory module 181 receives second address bit Add[0:N-1], and captures a newest value of received second address bit Add[0:N-1] at timing of an edge of clock CLK. Based on the newest value of second address bit Add[0:N-1], first memory module 181 performs data writing to memory array MARY or data reading from memory array MARY, and outputs internal address bit AQ1 of the newest value of second address bit Add[0:N-1]. Therefore, when first selection signal cen1 is "1", the internal address bit of the newest value of second address bit Add[0:N-1] is output from first memory module 181. When first selection signal cen1 is "0", an internal address bit of a previous value of second address bit Add[0:N-1] is output from first memory module 181.

Second memory module 182 receives second address bit Add[0:N-1], and captures the newest value of received second address bit Add[0:N-1] at timing of the edge of clock CLK. Based on the newest value of second address bit Add[0:N-1], second memory module 182 performs data writing to memory array MARY or data reading from memory array MARY, and outputs internal address bit AQ2 of the newest value of second address bit Add[0:N-1]. Therefore, when second selection signal cen2 is "1", the internal address bit of the newest value of second address bit Add[0:N-1] is output from second memory module 182. When second selection signal cen2 is "0", the internal address bit of the previous value of second address bit Add[0:N-1] is output from second memory module 182.

Comparator 184 compares bits obtained by synthesizing internal address bit AQ1 or AQ2 output from ERROR selector 283 and the most significant bit Add[N], with address signal A[0:N] output from CPU 202. Comparator 184 outputs failure notification signal ERROR when mismatch occurs.

When the level of selection enabling signal CEN is set to "1", the level of first selection signal cen1 is set to "0", and the level of second selection signal cen2 is set to "0" due to a failure in selection decoder 62, operation as described below is performed. Output AQ1 of first memory module 181 is set to the internal address bit of the previous value (that is, a value in an immediately previous cycle) of the second address bit, and output AQ2 of second memory module 182 is also set to the internal address bit of the previous value of the second address bit. By ERROR selector 283, any one of output AQ1 of first memory module 181 and output AQ2 of second memory module 182 is selected and input to comparator 184. Thus, since the internal address bit of the previous value of second address bit Add[0:N-1] is input to comparator 184, a failure can be sensed.

Eleventh Embodiment

Figure 19:
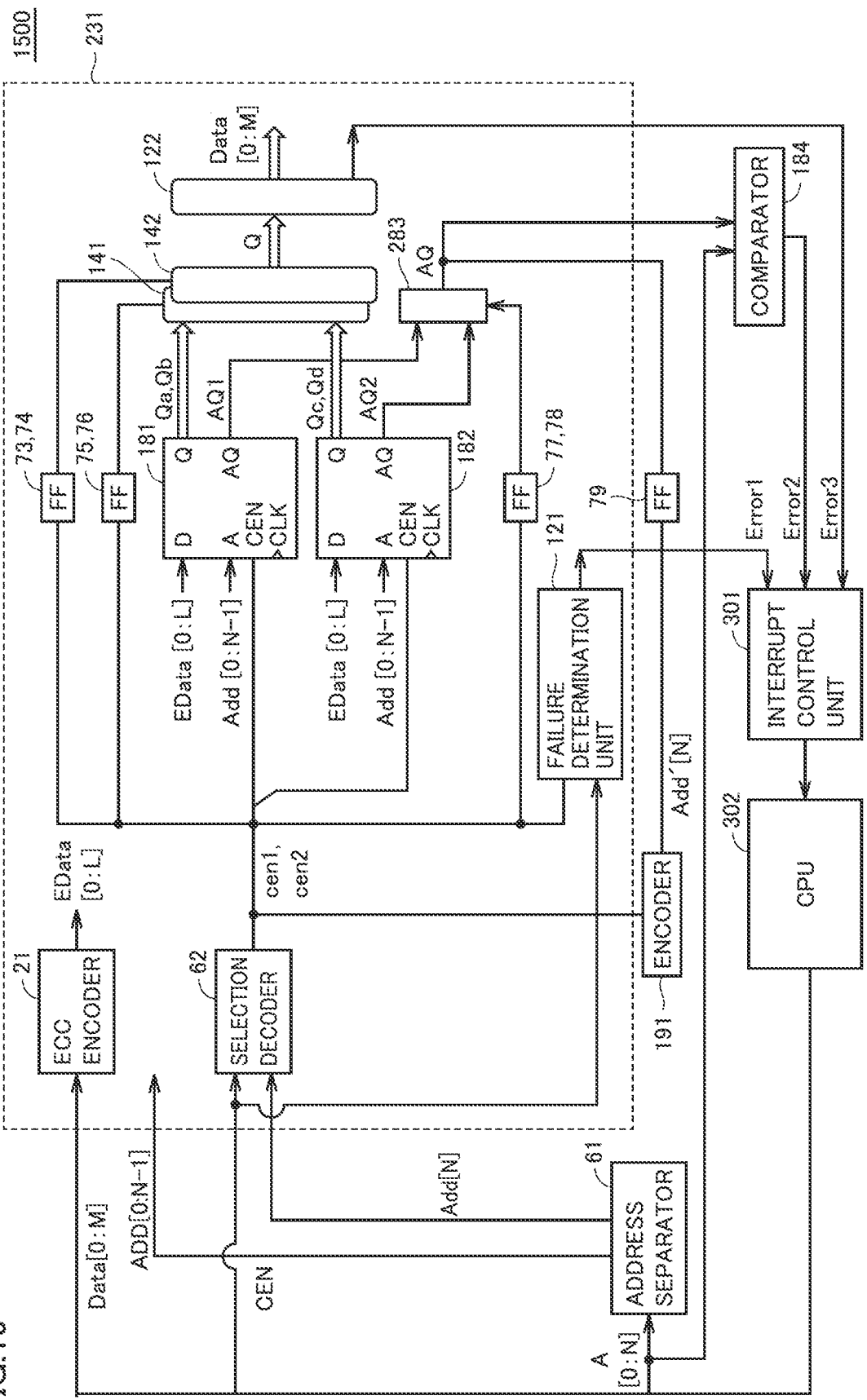
FIG. 19 is a view showing a configuration of a semiconductor device in an eleventh embodiment.

FIG. 19 is a view showing a configuration of a semiconductor device 1500 in an eleventh embodiment.

This semiconductor device 1500 includes address output function-equipped first memory module 181, address output function-equipped second memory module 182, address separator 61, selection decoder 62, ECC encoder 21, and ERROR selector 283. Semiconductor device 1500 further includes selector 141, selector 142, ECC decoder 122, failure determination unit 121, comparator 184, FFs 73, 74, 75, 76, 77, 78, and 79 an interrupt control unit 301, and a CPU 302.

Since address output function-equipped first memory module 181, address output function-equipped second memory module 182, address separator 61, selection decoder 62, ECC encoder 21, and ERROR selector 283 are the same as those described in any of the embodiments described above, description thereof will not be repeated. In addition, since selector 141, selector 142, ECC decoder 122, failure determination unit 121, comparator 184, and FFs 73, 74, 75, 76, 77, 78, and 79 are the same as those described in any of the embodiments described above, description thereof will not be repeated.

When failure determination unit 121 determines that selection decoder 62 is in a first failed state, failure determination unit 121 outputs a first failure notification signal ERROR1 to interrupt control unit 301. The first failed state refers to a failure that, when selection enabling signal CEN is "1", although one of first selection signal cen1 and second selection signal cen2 should be "1" and the other thereof should be "0", both of first selection signal cen1 and second selection signal cen2 are "0" or "1". It also refers to a failure such that, when selection enabling signal CEN is "1", although both of first selection signal cen1 and second selection signal cen2 should be "0", at least one of them is "1".

When two addresses input to comparator 184 do not match because selection decoder 62 is a second failed state, comparator 184 outputs a second failure notification signal ERROR2. The second failed state refers to a failure that the level of first selection signal cen1 is reversed and the level of second selection signal cen2 is also reversed.

When ECC decoder 122 detects an error because any of FFs 73, 74, 75, and 76 is in a failed state, ECC decoder 122 outputs a third failure notification signal ERROR3 to interrupt control unit 301.

Interrupt control unit 301 transmits first failure notification signal ERROR1, second failure notification signal ERROR2, and third failure notification signal ERROR3 to CPU 302. It is assumed that first failure notification signal ERROR1 has the highest priority, second failure notification signal ERROR2 has the second highest priority, and third failure notification signal ERROR3 has the lowest priority.

Figure 20:
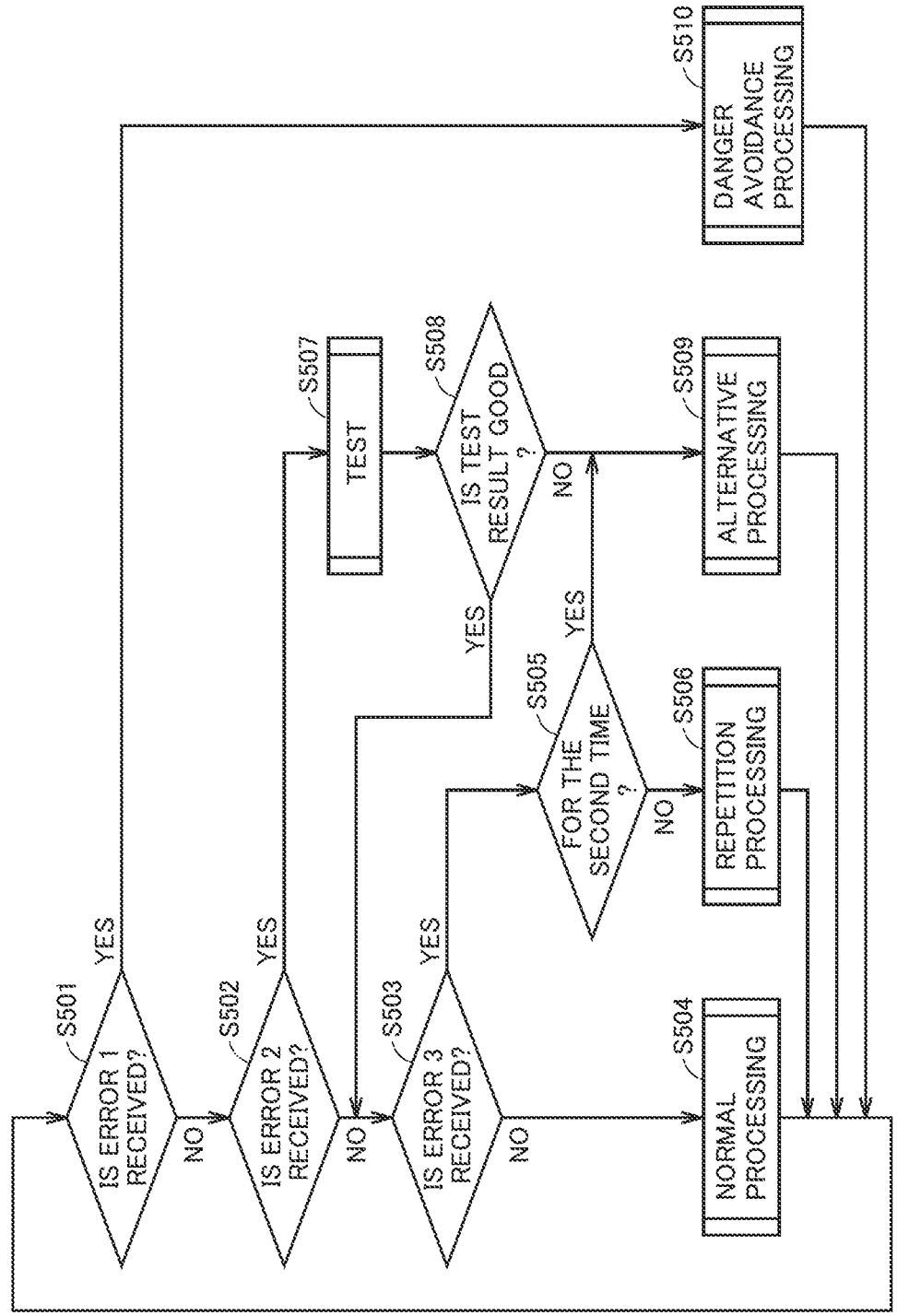
FIG. 20 is a flowchart showing a processing procedure by a CPU when a failure is notified.

FIG. 20 is a flowchart showing a processing procedure by CPU 302 when a failure is notified.

Referring to FIG. 20, in step S501, when CPU 302 receives first failure notification signal ERROR1, the processing proceeds to step S510, and when CPU 302 does not receive first failure notification signal ERROR1, the processing proceeds to step S502.

In step S502, when CPU 302 receives second failure notification signal ERROR2, the processing proceeds to step S507, and when CPU 302 does not receive second failure notification signal ERROR2, the processing proceeds to step S503.

In step S503, when CPU 302 receives third failure notification signal ERROR3, the processing proceeds to step S505, and when CPU 302 does not receive third failure notification signal ERROR3, the processing proceeds to step S504.

In step S505, when CPU 302 receives third failure notification signal ERROR3 for the second time, the processing proceeds to step S509, and when CPU 302 receives third failure notification signal ERROR3 for the first time, the processing proceeds to step S506.

In step S507, CPU 302 performs a test.

In step S508, when a test result is good, the processing proceeds to step S503, and when the test result is poor, the processing proceeds to step S509.

In step S504, CPU 302 provides control such that normal processing is performed.

In step S506, CPU 302 provides control such that repetition processing which repeats an immediately previous operation is performed.

In step S509, CPU 302 provides control such that alternative processing is performed.

In step S510, CPU 302 provides control such that danger avoidance processing is performed.

As described above, in the present embodiment, when a plurality of types of failure may occur, processing in accordance with the priority of the type of failure that occurs can be performed.

Twelfth Embodiment

Figure 21:
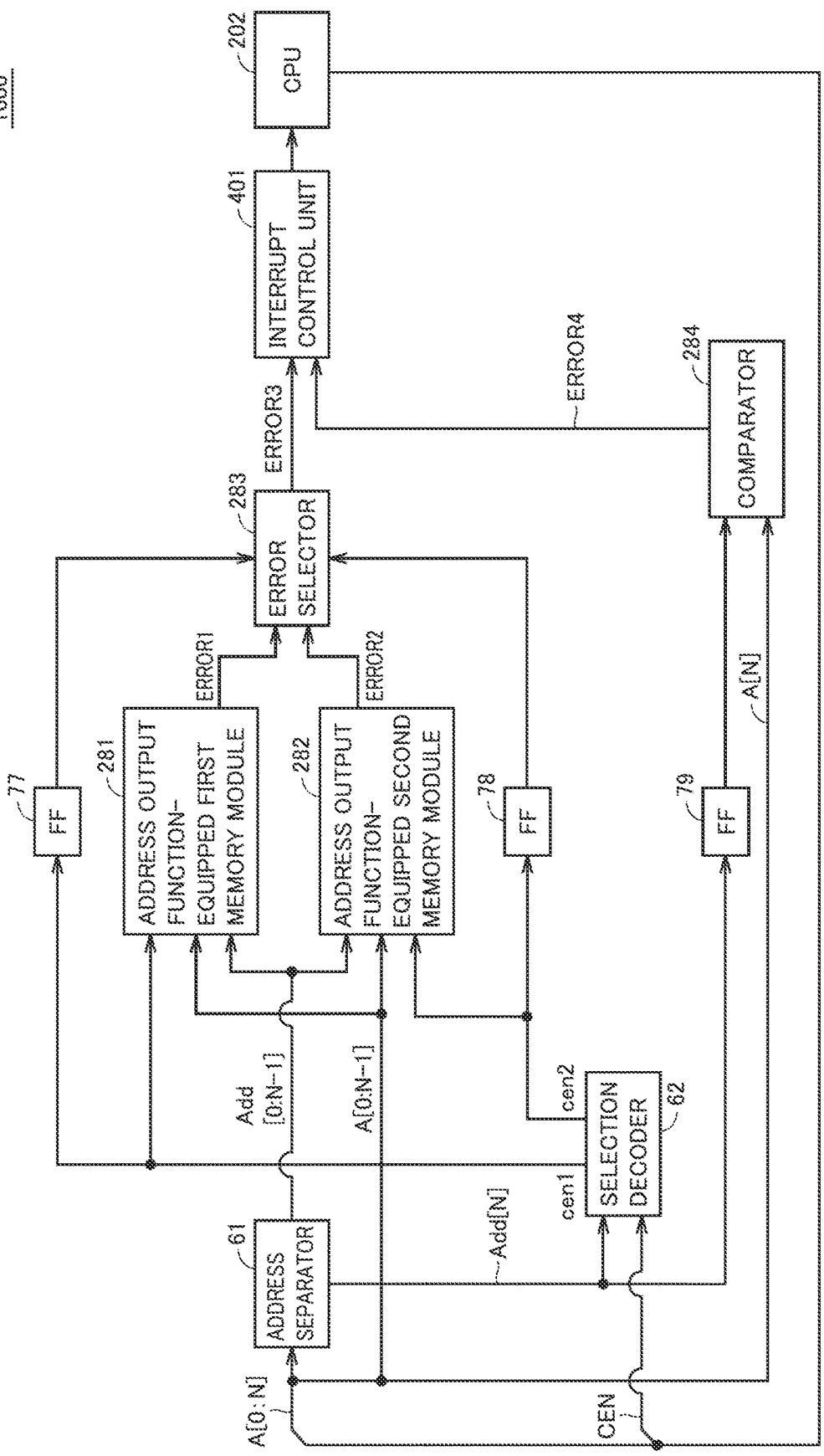
FIG. 21 is a view showing a configuration of a semiconductor device 1600 in a twelfth embodiment.

FIG. 21 is a view showing a configuration of a semiconductor device 1600 in a twelfth embodiment.

Referring to FIG. 21, this semiconductor device 1600 includes an address output function-equipped first memory module 281, an address output function-equipped second memory module 282, address separator 61, selection decoder 62, ERROR selector 283, a comparator 284, FFs 77, 78, and 79, an interrupt control unit 401, and CPU 202.

Since address separator 61, selection decoder 62, FFs 77, 78, and 79, and CPU 202 are the same as those in reference example 2, description thereof will not be repeated.

Address output function-equipped first memory module 281 and address output function-equipped second memory module 282 each include a memory array having a plurality of SRAM memory cells, and an SRAM logic circuit, as with first memory module 45 in the second embodiment.

N-bit second address bit Add[0:N−1] (a first address signal) output from address separator 61 and an N-bit address bit A[0:N−1] (a second address signal) sent directly from CPU 202 are input to each of address output function-equipped first memory module 281 and address output function-equipped second memory module 282. Address bit A[0:N−1] serves as an expected value signal for checking whether or not an internal address bit AQ1[0:N−1] is normal.

Address output function-equipped first memory module 281 receives first selection signal cen1. In address output function-equipped first memory module 281, data can be read and written when the level of first selection signal cen1 is "1" which is an activated level. In address output function-equipped first memory module 281, data cannot be read and written when the level of first selection signal cen1 is "0" which is a deactivated level.

Address output function-equipped second memory module 282 receives second selection signal cen2. In address output function-equipped second memory module 282, data can be read and written when the level of second selection signal cen2 is "1" which is an activated level. In address output function-equipped second memory module 282, data cannot be read and written when the level of second selection signal cen2 is "0" which is a deactivated level.

Figure 22:
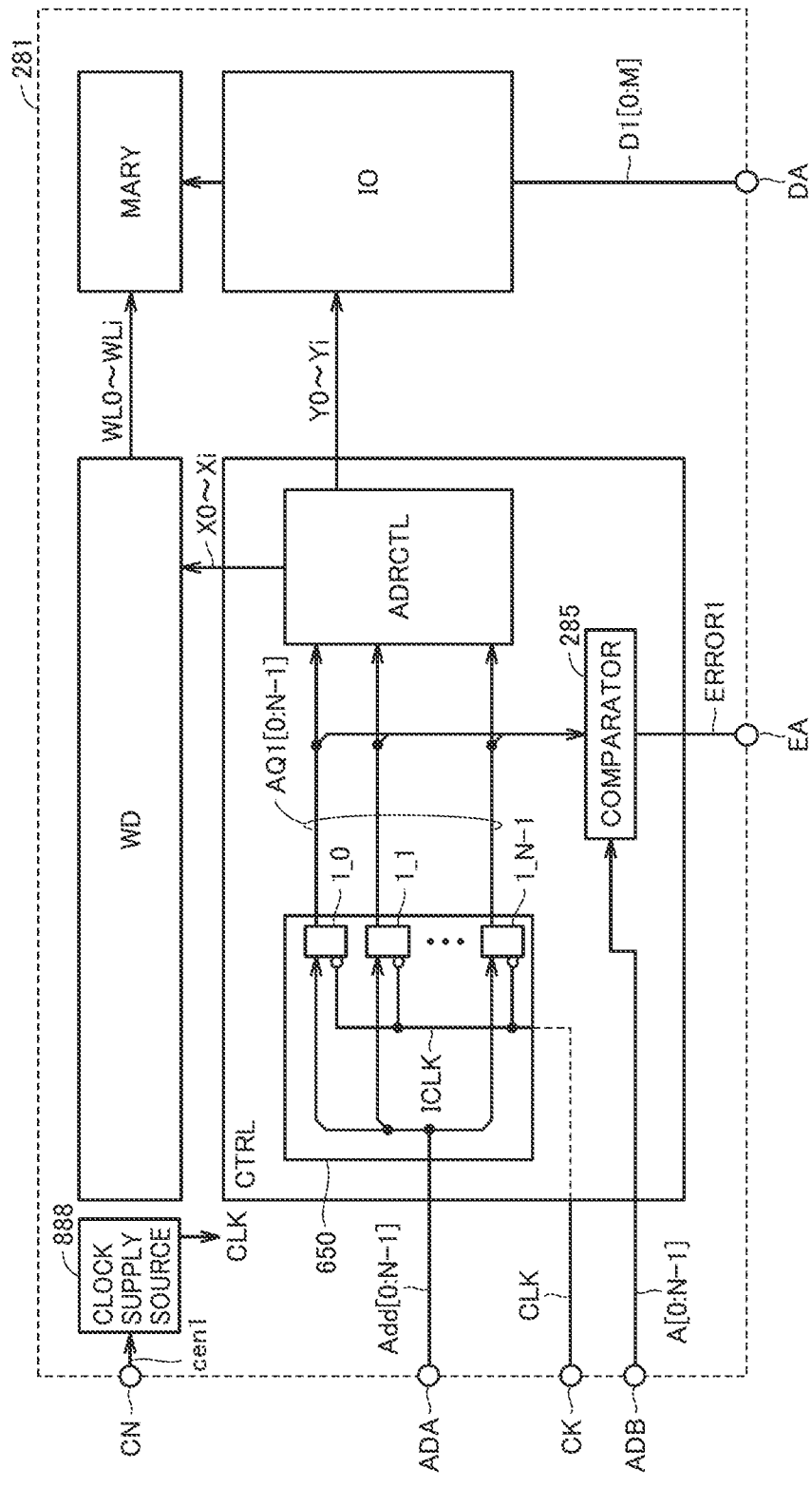
FIG. 22 is a view showing a configuration of an address output function-equipped first memory module 281.

FIG. 22 is a view showing a configuration of address output function-equipped first memory module 281. The configuration of address output function-equipped second memory module 282 is also the same as this configuration.

Referring to FIG. 22, address output function-equipped first memory module 281 is different from first memory module 41 in FIG. 3 in that it includes a comparator 285, a failure notification output terminal EA, an address input terminal ADB, a clock supply source 888, and a selection terminal CN.

Address input terminal ADB receives N-bit address bit A[0:N−1] (having a first number of lower-order bits), of (N+1)-bit address signal A[0:N], directly from CPU 202.

Selection terminal CN receives first selection signal cen1, and outputs it to clock supply source 888. When the level of first selection signal cen1 is "1" which is an activated level, clock supply source 888 supplies clock CLK to address output function-equipped first memory module 281. When the level of first selection signal cen1 is "0" which is a deactivated level, clock supply source 888 does not supply clock CLK to address output function-equipped first memory module 281.

Comparator 285 compares N-bit address bit A[0:N−1] sent from address input terminal ADB with N-bit internal address bit AQ1[0:N−1] output from temporary storage circuit 650. Comparator 285 outputs failure notification signal ERROR1 when mismatch occurs in a comparison result.

Failure notification output terminal EA outputs failure notification signal ERROR1.

Address output function-equipped second memory module 282 similarly outputs failure notification signal ERROR2.

Referring to FIG. 21 again, ERROR selector 283 selects any of failure notification signal ERROR1 output from first memory module 281 and failure notification signal ERROR2 output from second memory module 282 based on the level of first selection signal cen1 and the level of second selection signal cen2, and outputs the selected failure notification signal to interrupt control unit 401, as failure notification signal ERROR3.

When the level of first selection signal cen1 is "1" which is an activated level and the level of second selection signal cen2 is "0" which is a deactivated level, ERROR selector 283 selects failure notification signal ERROR1 output from first memory module 281. When the level of first selection signal cen1 is "0" which is a deactivated level and the level of second selection signal cen2 is "1" which is an activated level, ERROR selector 283 selects failure notification signal ERROR2 output from second memory module 282. When the level of first selection signal cen1 is "0" and the level of second selection signal cen2 is "0", ERROR selector 283 selects any of failure notification signal ERROR1 output from first memory module 281 and failure notification signal ERROR2 output from second memory module 282. When the level of first selection signal cen1 is "1" and the level of second selection signal cen2 is "1", ERROR selector 283 selects any of failure notification signal ERROR1 output from first memory module 281 and failure notification signal ERROR2 output from second memory module 282.

Comparator 284 compares first address bit Add[N] output from address separator 61, with a first address bit A[N] sent directly from CPU 202. Comparator 284 outputs a failure notification signal ERROR4 to interrupt control unit 401 when mismatch occurs in a comparison result.

When interrupt control unit 401 receives failure notification signal ERROR3 or failure notification signal ERROR4, interrupt control unit 401 sends CPU 202 an interrupt notification that a failure is sensed.

According to the present embodiment, a comparator is provided in a memory module, and a failure is determined by comparing addresses in the memory module. Thus, it is only necessary to output a 1-bit signal from a memory module in the present embodiment, in contrast to a conventional case where an N-bit signal is output from a memory module. Here, N is the number of bits of an address signal.

Figure 23:
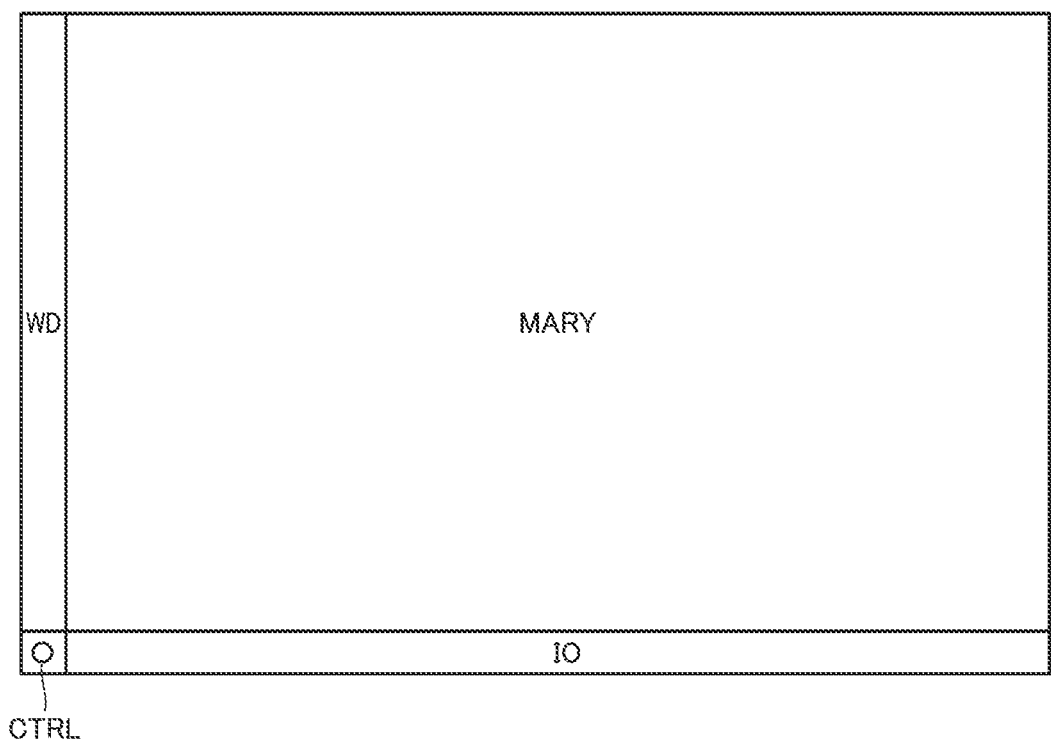
FIG. 23 is a view showing a layout of address output function-equipped first memory module 281.

FIG. 23 is a view showing a layout of address output function-equipped first memory module 281. The layout of address output function-equipped second memory module 282 is also the same as this layout.

Input/output terminals for memory module 281 are arranged in the vicinity of control unit CTRL in a concentrated manner. When there are many signal lines connected to the input/output terminals, current concentration is likely to occur in the vicinity of control unit CTRL. In the present embodiment, it is possible to suppress a large amount of current from flowing to a specific place in a concentrated manner, by reducing the number of bits of an output signal.

Thirteenth Embodiment

Figure 24:
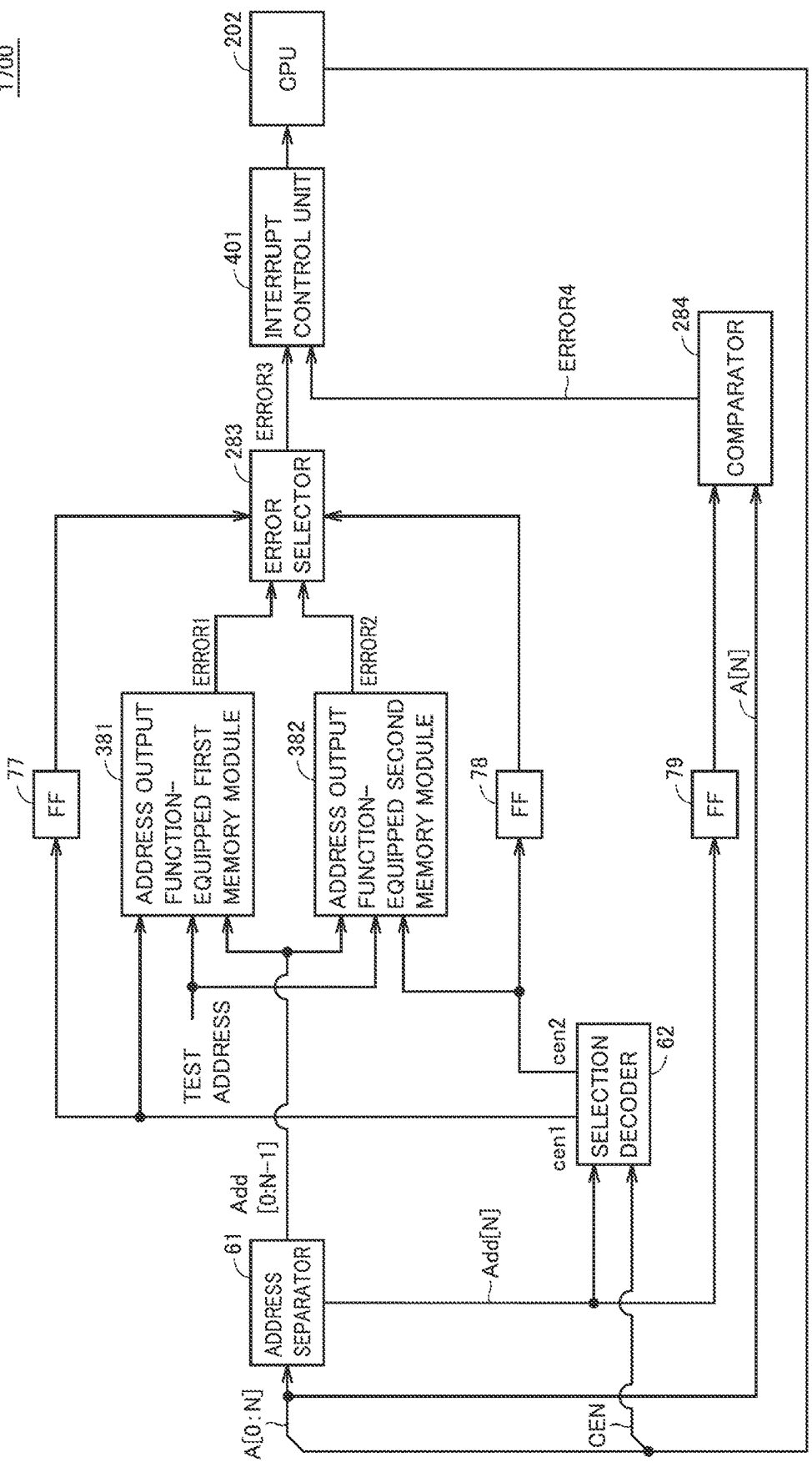
FIG. 24 is a view showing a configuration of a semiconductor device 1700 in a thirteenth embodiment.

FIG. 24 is a view showing a configuration of a semiconductor device 1700 in a thirteenth embodiment.

Referring to FIG. 24, this semiconductor device 1700 includes an address output function-equipped first memory module 381, an address output function-equipped second memory module 382, address separator 61, selection decoder 62, ERROR selector 283, comparator 284, FFs 77, 78, and 79, interrupt control unit 401, and CPU 202.

Since address separator 61, selection decoder 62, FFs 77, 78, and 79, and CPU 202 are the same as those in reference example 2, description thereof will not be repeated. Since ERROR selector 283, comparator 284, and interrupt control unit 401 are the same as those in the twelfth embodiment, description thereof will not be repeated.

Address output function-equipped first memory module 381 and address output function-equipped second memory module 382 each include a memory array having a plurality of SRAM memory cells, and an SRAM logic circuit, as with first memory module 45 in the second embodiment.

N-bit second address bit Add[0:N−1] output from address separator 61 and a test address are input to each of address output function-equipped first memory module 381 and address output function-equipped second memory module 382.

Address output function-equipped first memory module 381 receives first selection signal cen1. In address output function-equipped first memory module 381, data can be read and written when the level of first selection signal cen1 is "1" which is an activated level. In address output function-equipped first memory module 381, data cannot be read and written when the level of first selection signal cen1 is "0" which is a deactivated level.

Address output function-equipped second memory module 382 receives second selection signal cen2. In address output function-equipped second memory module 382, data can be read and written when the level of second selection signal cen2 is "1" which is an activated level. In address output function-equipped second memory module 382, data cannot be read and written when the level of second selection signal cen2 is "0" which is a deactivated level.

Figure 25:
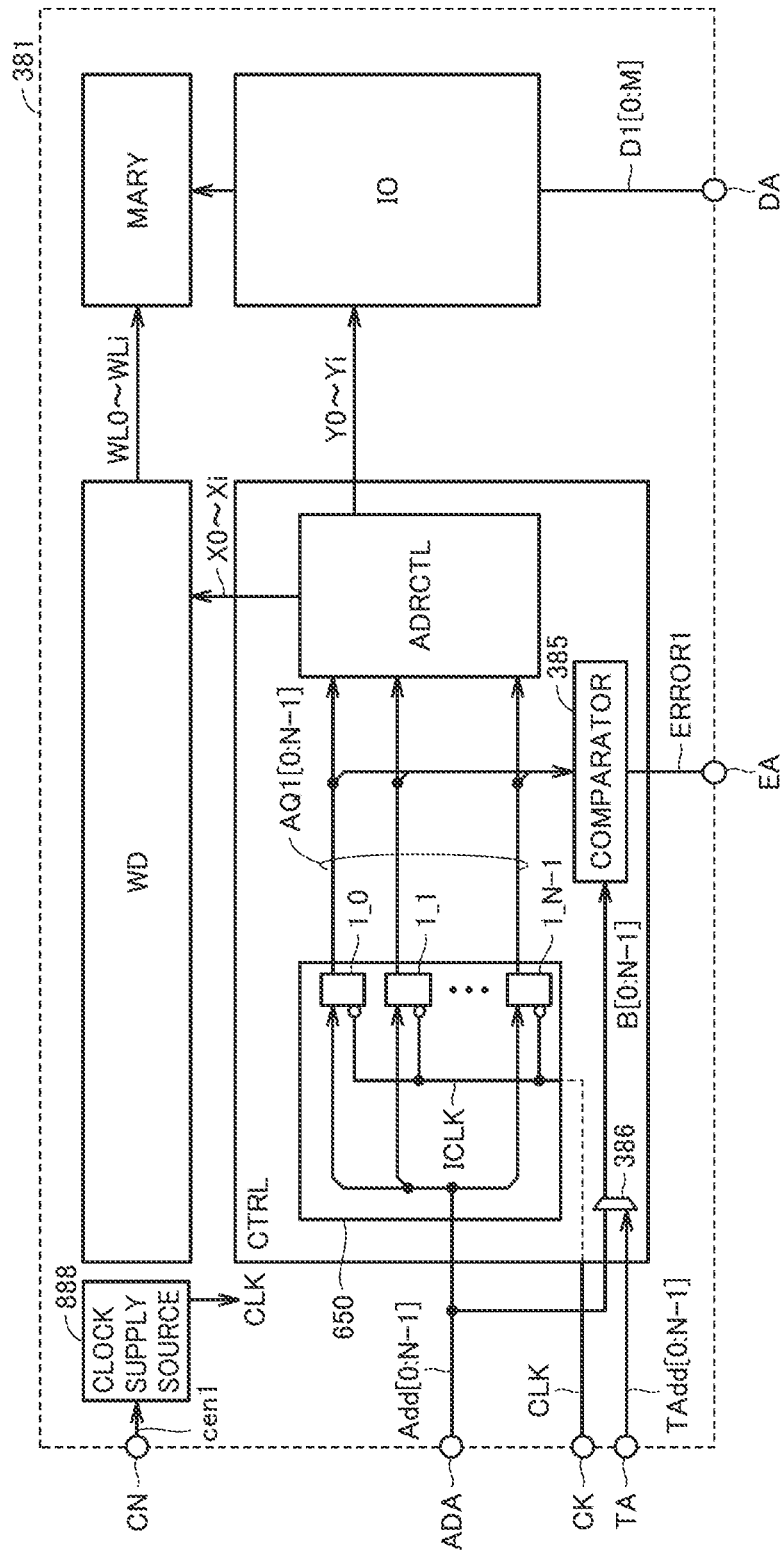
FIG. 25 is a view showing a configuration of an address output function-equipped first memory module 381.

FIG. 25 is a view showing a configuration of address output function-equipped first memory module 381. The configuration of address output function-equipped second memory module 382 is also the same as this configuration.

Referring to FIG. 25, address output function-equipped first memory module 381 is different from first memory module 41 in FIG. 3 in that it includes a comparator 385, failure notification output terminal EA, a test address input terminal TA, a selector 386, clock supply source 888, and selection terminal CN.

For example, an N-bit test address signal TAdd[0:N−1] sent directly from CPU 202 is input to test address input terminal TA. For example, test address signal TAdd[0:N−1] can be a signal in which all bits are 0 or a signal in which all bits are 1.

It should be noted that the test address signal to be input to test address input terminal TA is not limited to N-bit test address signal TAdd[0:N−1]. The test address signal may be a 1-bit test address signal, for example. When memory module 381 receives a 1-bit test address signal, an N-bit test address signal may be generated and supplied to selector 386.

Selection terminal CN receives first selection signal cen1, and outputs it to clock supply source 888. When the level of first selection signal cen1 is "1" which is an activated level, clock supply source 888 supplies clock CLK to address output function-equipped first memory module 381. When the level of first selection signal cen1 is "0" which is a deactivated level, clock supply source 888 does not supply clock CLK to address output function-equipped first memory module 381.

Selector 386 selects any of N-bit second address bit Add[0:N−1] sent from address input terminal ADA and N-bit test address signal TAdd[0:N−1] sent from test address input terminal TA in accordance with a control signal not shown, and outputs the selected one to comparator 385 as an address bit B[0:N−1]. When second address bit Add[0:N−1] is selected, second address bit Add[0:N−1] serves as an expected value signal for checking whether or not internal address bit AQ1[0:N−1] is normal. When test address signal TAdd[0:N−1] is selected, test address signal TAdd[0:N−1] serves as a signal for checking whether or not comparator 385 is normal.

Comparator 385 compares N-bit address bit B[0:N−1] output from selector 386 with N-bit internal address bit AQ1[0:N−1] output from temporary storage circuit 650. Comparator 385 outputs failure notification signal ERROR1 when mismatch occurs in a comparison result.

Failure notification output terminal EA outputs failure notification signal ERROR1.

Address output function-equipped second memory module 382 similarly outputs failure notification signal ERROR2.

In the present embodiment, by adopting a test address having bits less than N bits, the number of input terminals of a memory module can be reduced when compared with the twelfth embodiment. Thus, a wire area in the vicinity of the memory module can be reduced, and a free area can be opened as a power source enhanced area. Accordingly, current concentration can be further avoided. In addition, in the present embodiment, a failure in a comparator in the memory module can also be detected.

It should be noted that the memory module in the twelfth embodiment may also be provided with test address input terminal TA to which a test address is input, and a selector which selects test address TAdd[0:N−1] or address bit A[0:N−1] and supplies the selected one to a comparator.

Fourteenth Embodiment

Figure 26:
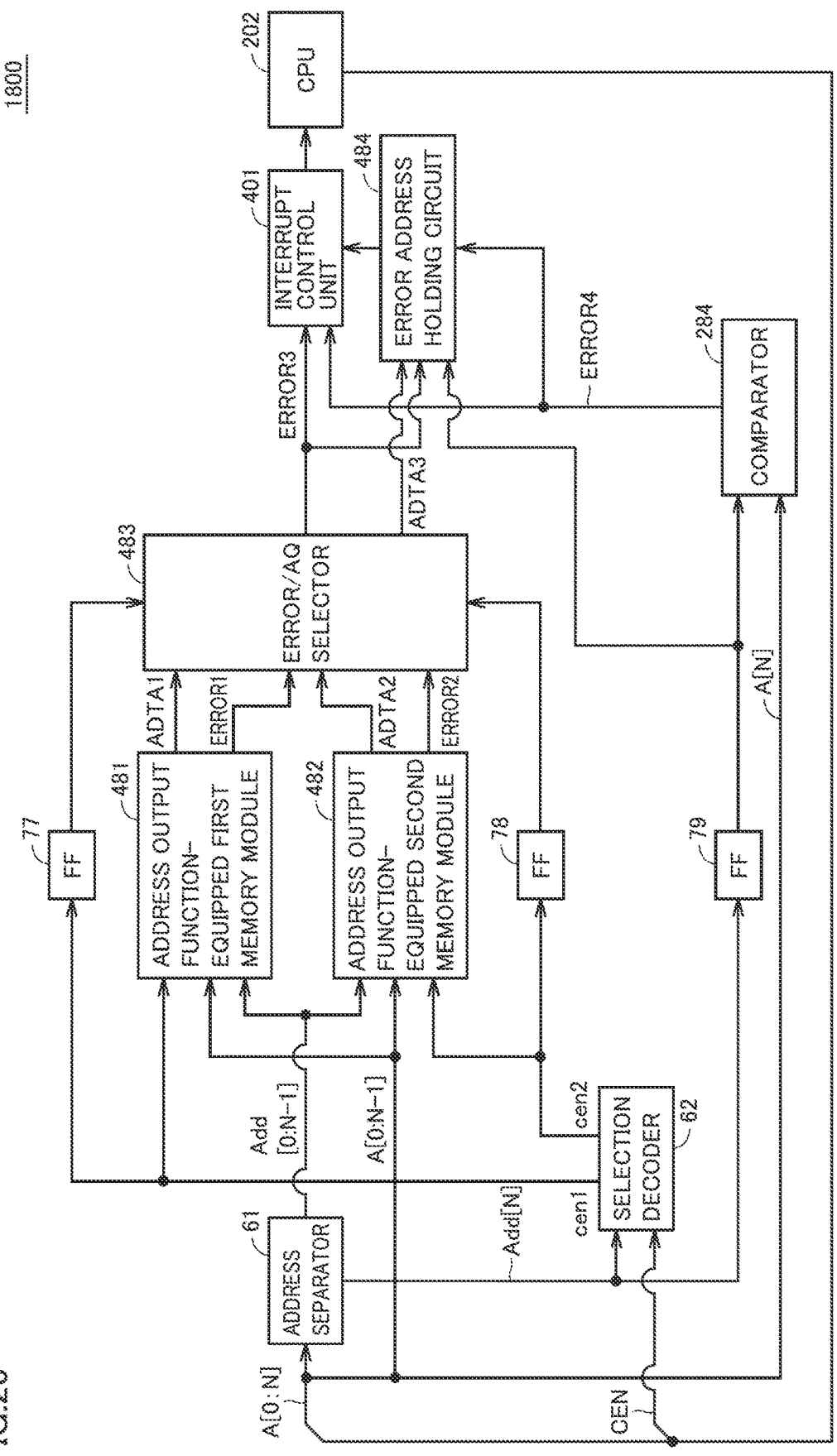
FIG. 26 is a view showing a configuration of a semiconductor device 1800 in a fourteenth embodiment.

FIG. 26 is a view showing a configuration of a semiconductor device 1800 in a fourteenth embodiment.

Referring to FIG. 26, this semiconductor device 1800 includes an address output function-equipped first memory module 481, an address output function-equipped second memory module 482, address separator 61, selection decoder 62, an ERROR/AQ selector 483, comparator 284, FFs 77, 78, and 79, interrupt control unit 401, an error address holding circuit 484, and CPU 202.

Since address separator 61, selection decoder 62, FFs 77, 78, and 79, and CPU 202 are the same as those in reference example 2, description thereof will not be repeated. Since comparator 284 and interrupt control unit 401 are the same as those in the twelfth embodiment, description thereof will not be repeated.

Address output function-equipped first memory module 481 and address output function-equipped second memory module 482 each include a memory array having a plurality of SRAM memory cells, and an SRAM logic circuit, as with first memory module 45 in the second embodiment.

N-bit second address bit Add[0:N−1] output from address separator 61 and N-bit address bit A[0:N−1] sent directly from CPU 202 are input to each of address output function-equipped first memory module 481 and address output function-equipped second memory module 482.

Address output function-equipped first memory module 481 receives first selection signal cen1. In address output function-equipped first memory module 481, data can be read and written when the level of first selection signal cen1 is "1" which is an activated level. In address output function-equipped first memory module 481, data cannot be read and written when the level of first selection signal cen1 is "0" which is a deactivated level.

Address output function-equipped second memory module 482 receives second selection signal cen2. In address output function-equipped second memory module 482, data can be read and written when the level of second selection signal cen2 is "1" which is an activated level. In address output function-equipped second memory module 482, data cannot be read and written when the level of second selection signal cen2 is "0" which is a deactivated level.

Figure 27:
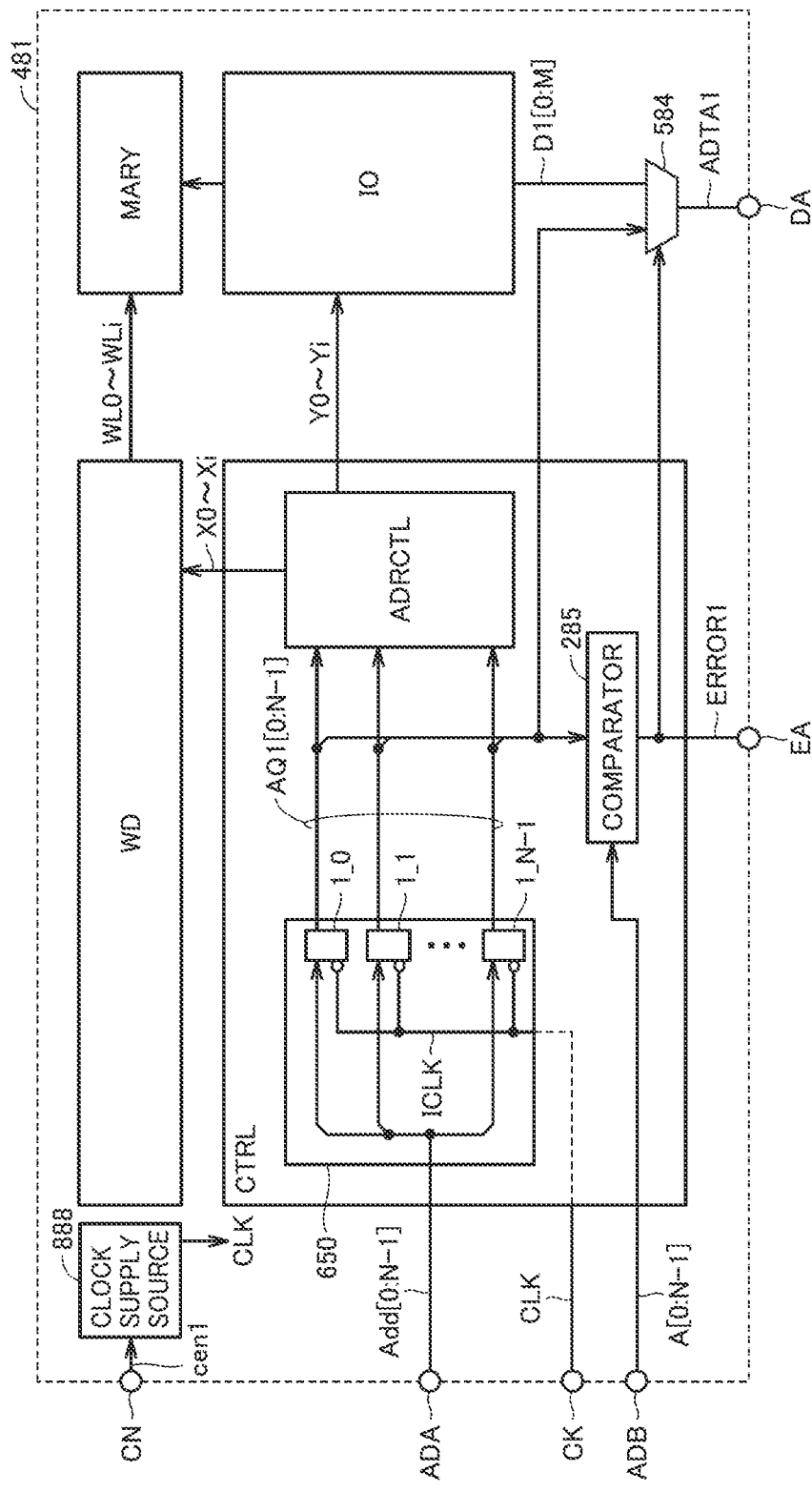
FIG. 27 is a view showing a configuration of an address output function-equipped first memory module 481.

FIG. 27 is a view showing a configuration of address output function-equipped first memory module 481. The configuration of address output function-equipped second memory module 482 is also the same as this configuration.

Referring to FIG. 27, address output function-equipped first memory module 481 is different from address output function-equipped first memory module 281 in FIG. 22 in that it includes a selector 584.

Selector 584 selects one of N-bit internal address bit AQ1[0:N−1] output from temporary storage circuit 650 and data signal D1[0:M] output from data input/output unit IO, and outputs the selected signal to data input/output terminal DA, as memory module output data ADTA1. When selector 584 does not receive failure notification signal ERROR1, selector 584 selects data signal D1[0:M]. When selector 584 receives failure notification signal ERROR1, selector 584 selects internal address bit AQ1[0:N−1].

Address output function-equipped second memory module 482 outputs failure notification signal ERROR2 and memory module output data ADTA2.

ERROR/AQ selector 483 selects any of failure notification signal ERROR1 output from first memory module 481 and failure notification signal ERROR2 output from second memory module 482 based on the level of first selection signal cen1 and the level of second selection signal cen2. ERROR/AQ selector 483 outputs the selected failure notification signal to interrupt control unit 401 and error address holding circuit 484, as failure notification signal ERROR3.

ERROR/AQ selector 483 selects any of memory module output data ADTA1 output from first memory module 481 and memory module output data ADTA2 output from second memory module 482 based on the level of first selection signal cen1 and the level of second selection signal cen2. ERROR/AQ selector 483 outputs the selected one to error address holding circuit 484, as memory module output data ADTA3.

When the level of first selection signal cen1 is "1" which is an activated level and the level of second selection signal cen2 is "0" which is a deactivated level, ERROR/AQ selector 483 selects failure notification signal ERROR1 and memory module output data ADTA1 output from first memory module 481.

When the level of first selection signal cen1 is "0" which is a deactivated level and the level of second selection signal cen2 is "1" which is an activated level, ERROR/AQ selector 483 selects failure notification signal ERROR2 and memory module output data ADTA2 output from second memory module 482.

When the level of first selection signal cen1 is "0" and the level of second selection signal cen2 is "0", ERROR/AQ selector 483 selects any of failure notification signal ERROR1 and failure notification signal ERROR2, and selects any of memory module output data ADTA1 and memory module output data ADTA2.

When the level of first selection signal cen1 is "1" and the level of second selection signal cen2 is "1", ERROR/AQ selector 483 selects any of failure notification signal ERROR1 and failure notification signal ERROR2, and selects any of memory module output data ADTA1 and memory module output data ADTA2.

Error address holding circuit 484 receives memory module output data ADTA3. When error address holding circuit 484 receives failure notification signal ERROR3, error address holding circuit 484 holds memory module output data ADTA3. This is because, when error address holding circuit 484 receives failure notification signal ERROR3, memory module output data ADTA3 indicates internal address bit AQ1[0:N−1] or AQ2[0:N−1].

In addition, error address holding circuit 484 receives first address bit Add[N]. When error address holding circuit 484 receives failure notification signal ERROR4, error address holding circuit 484 holds first address bit Add[N].

According to the present embodiment, when a failure notification signal is output, an address related to a failure is held in the error address holding circuit. This can eliminate a job for specifying an address related to a failure by performing a memory BIST (Built-In Self Test) when the failure is notified.

(Variations)

The present disclosure is not limited to the embodiments described above, and also includes, for example, variations as described below.

(1) Number of Memory Modules

Although the second to eleventh embodiments have described a case where a semiconductor device includes one or two memory modules, the number of memory modules is not limited thereto. For example, a semiconductor device may include $2^N$ memory modules.

When there are $2^N$ memory modules, address separator 61 can set higher-order N bits from the MSB side of an address signal as a first address bit for selecting a memory module, and can set other bits as a second address bit. The selection decoder generates selection signals cen1 to cen$2^N$ to be supplied to the $2^N$ memory modules. Failure determination units 121 and 131 in FIGS. 4 and 7 determine a failure in selection decoder 62 based on selection enabling signal CEN and selection signals cen1 to cen$2^N$. Selector 141 in FIG. 8 selects any of a plurality of bits in $2^N$ first groups output from the $2^N$ memory modules based on selection signals cen1 to cen$2^N$. Selector 142 in FIG. 8 selects any of a plurality of bits in $2^N$ second groups output from the $2^N$ memory modules based on selection signals cen1 to cen$2^N$. ERROR selector 283 in FIGS. 17 and 18 selects any of $2^N$ internal address bits output from the $2^N$ memory modules based on selection signals cen1 to cen$2^N$.

(2) ECC in Seventh Embodiment

In the seventh embodiment, ECC encoder 221 and ECC decoder 222 may be omitted, and only data and an address may be stored in memory array 162.

(3) Memory Module

The memory modules described in the ninth embodiment may be configured to be operated when a selection signal is activated. For example, when the selection signal is deactivated, a clock source in a memory module may stop supply of the clock to each component in the memory module.

(Appendix)

It should be noted that, based on the embodiments described above, the present disclosure also includes inventions as described below.

(Claim A)

A semiconductor device comprising:

a memory array having a plurality of normal memory cells and a redundant memory cell;

a redundant decoder configured to decode an address signal of a defective memory cell among the plurality of normal memory cells, and output an address decoding signal;

a first redundant control circuit configured to provide control such that data is written in the redundant memory cell, instead of the defective memory cell, in accordance with the address decoding signal;

a second redundant control circuit configured to provide control such that data is read from the redundant memory cell, instead of the defective memory cell, in accordance with the address decoding signal;

an encoder configured to encode the address decoding signal and output an address signal; and a comparator configured to compare the address signal to be input to the redundant decoder with the address signal output from the encoder.

(Claim B)

A semiconductor device comprising:

a memory array having a plurality of normal memory cells and a redundant memory cell;

a first redundant decoder configured to decode an address signal of a defective memory cell among the plurality of normal memory cells, and output a first address decoding signal, during data writing;

a second redundant decoder configured to decode the address signal of the defective memory cell among the plurality of normal memory cells, and output a second address decoding signal, during data reading;

an ECC encoder configured to perform error detection/correction encoding on data to the memory array;

a first redundant control circuit configured to provide control such that, during data writing, an output of the ECC encoder is written in the redundant memory cell, instead of the defective memory cell, in accordance with the first address decoding signal;

a second redundant control circuit configured to provide control such that, during data reading, data is read from the redundant memory cell, instead of the defective memory cell, in accordance with the second address decoding signal; and an ECC decoder configured to perform error detection/correction on data output from the memory array.

(Claim C)

A semiconductor device comprising:

a memory array configured to store a bit sequence including data, an address, and a check bit;

an address decoder configured to decode an address for writing and output a first decoding signal during data writing to the memory array, and decode an address for reading and output a second decoding signal during data reading from the memory array; and an ECC encoder configured to perform error detection/correction encoding on a bit sequence including data and an address for writing and generate the check bit during data writing, wherein a bit sequence including the data, the address for writing, and the check bit is written at a position designated by the first decoding signal in the memory array, and during data reading, the memory array outputs a bit sequence including data, an address, and a check bit, from a position designated by the second decoding signal, the semiconductor device further comprising:

an ECC decoder configured to perform error detection/correction on the bit sequence output from the memory array; and a comparator configured to compare an address output from the ECC decoder with the address for reading.

(Claim D)

A semiconductor device comprising:

a memory array configured to store a bit sequence including data and a check bit;

an address decoder configured to decode an address for writing and output a first decoding signal during data writing to the memory array, and decode an address for reading and output a second decoding signal during data reading from the memory array; and an ECC encoder configured to perform error detection/correction encoding on a bit sequence including data and an address for writing and generate the check bit during data writing, wherein a bit sequence including the data and the check bit is written at a position designated by the first decoding signal in the memory array, and during data reading, the memory array outputs a bit sequence including data and a check bit, from a position designated by the second decoding signal, the semiconductor device further comprising:

an ECC decoder configured to add the address for reading to the bit sequence output from the memory array and perform error detection/correction.

(Claim E)

A semiconductor device comprising:

a plurality of memory modules, a plurality of bits indicating an address signal indicating a storage position of data in the plurality of memory modules including a first address bit and a second address bit, each of the plurality of memory modules receiving the second address bit and outputting an internal address bit generated from the second address bit;

a selection decoder configured to decode the first address bit and control levels of a plurality of selection signals;

a failure determination unit configured to determine whether or not the selection decoder is in a failed state based on the levels of the plurality of selection signals, and output a first failure notification signal when the selection decoder is in the failed state;

an encoder configured to encode the plurality of selection signals and output an address bit;

a first selector configured to select any of the internal address bits output from the plurality of memory modules based on the levels of the plurality of selection signals;

a comparator configured to compare a bit sequence obtained by synthesizing the internal address bit output from the first selector and the address bit output from the encoder, with the plurality of bits indicating the address signal, and output a second failure notification signal when mismatch occurs; and an ECC encoder configured to perform error detection/correction encoding on write data, wherein the error detection/correction encoded write data is written in each of the plurality of memory modules when a corresponding one of the selection signals is at the activated level, and a plurality of bits of output data from each of the plurality of memory modules are classified into a plurality of bits in a first group and a plurality of bits in a second group, the semiconductor device further comprising:

a second selector configured to select and output any of the plurality of bits in a plurality of the first groups output from the plurality of memory modules based on the levels of the plurality of selection signals;

a third selector configured to select and output any of the plurality of bits in a plurality of the second groups output from the plurality of memory modules based on the levels of the plurality of selection signals;

an ECC decoder configured to perform error detection/correction on a bit sequence obtained by synthesizing an output of the second selector and an output of the third selector, and output a third failure notification signal when an error is detected; and a CPU configured to perform processing in accordance with a type of a received failure notification signal.

(Claim F)

A semiconductor device comprising:

a plurality of memory modules, a plurality of bits indicating an address signal indicating a storage position of data in the plurality of memory modules including a first address bit and a second address bit, each of the plurality of memory modules receiving the second address bit and outputting an internal address bit generated from the second address bit;

a selection decoder configured to decode the first address bit and control levels of a plurality of selection signals;

an encoder configured to encode the plurality of selection signals and output an address bit;

a selector configured to select any of the internal address bits output from the plurality of memory modules based on the levels of the plurality of selection signals; and a comparator configured to compare a bit sequence obtained by synthesizing the internal address bit output from the selector and the address bit output from the encoder, with the plurality of bits indicating the address signal.

(Claim G)

A semiconductor device comprising:

a plurality of memory modules, a plurality of bits indicating an address signal indicating a storage position of data in the plurality of memory modules including a first address bit and a second address bit, each of the plurality of memory modules receiving the second address bit and outputting an internal address bit generated from the second address bit;

a selection decoder configured to decode the first address bit and control levels of a plurality of selection signals; and a plurality of clock gates each configured to receive a clock, and output the clock to a corresponding one of the memory modules when a corresponding one of the selection signals is at an activated level, wherein when each of the plurality of memory modules receives the clock output from a corresponding one of the clock gates, each of the plurality of memory modules outputs the internal address bit generated from a newest value of the second address bit, the semiconductor device further comprising:

a selector configured to select any of the internal address bits output from the plurality of memory modules based on the levels of the plurality of selection signals;

a comparator configured to compare bits obtained by synthesizing the internal address bit output from the selector and the first address bit, with the address signal; and a plurality of flip-flops each provided in a path through which a corresponding one of the selection signals is supplied to the selector, wherein a same clock signal is input to the plurality of flip-flops and the plurality of memory modules.

Although the embodiments of the present invention have been described, it should be understood that the embodiments disclosed herein are illustrative and non-restrictive in every respect. The scope of the present invention is defined by the scope of the claims, and is intended to include any modifications within the scope and meaning equivalent to the scope of the claims.

What is claimed is:

1. A semiconductor device comprising:

a selection decoder configured to control levels of a plurality of selection signals based on an address bit having at least one or more bits;

a plurality of memory modules which are each selected when a corresponding one of the selection signals is at an activated level, and in which data can be read and written; and a failure determination unit configured to determine whether or not the selection decoder is in a failed state based on the levels of the plurality of selection signals.

2. The semiconductor device according to claim 1, comprising a CPU, wherein when the failure determination unit determines that the selection decoder is in the failed state, the failure determination unit outputs, to the CPU, a signal notifying that the selection decoder is in the failed state.

3. The semiconductor device according to claim 1, wherein the semiconductor device comprises an ECC encoder configured to perform error detection/correction encoding on write data, the error detection/correction encoded write data is written in each of the plurality of memory modules when the corresponding one of the selection signals is at the activated level, the semiconductor device further comprises:

a selector configured to select any of output data from the plurality of memory modules based on the levels of the plurality of selection signals; and an ECC decoder configured to perform error detection/correction on an output of the selector, and when it is determined that the selection decoder is in the failed state, the selector reverses a first number of bits of a plurality of bits of the selected output data, the first number of bits being a number of bits which is more than an upper limit of a number of bits of an error which can be corrected, and less than or equal to an upper limit of a number of bits of an error which can be detected in the ECC decoder.

4. The semiconductor device according to claim 1, wherein the semiconductor device comprises an ECC encoder configured to perform error detection/correction encoding on write data, during data writing, the error detection/correction encoded write data is written in each of the plurality of memory modules when the corresponding one of the selection signals is at the activated level, during data reading, a plurality of bits constituting output data of each of the plurality of memory modules are classified into a plurality of bits in a first group and a plurality of bits in a second group, the semiconductor device further comprises:

a first selector configured to select and output any of the plurality of bits in a plurality of the first groups output from the plurality of memory modules based on the levels of the plurality of selection signals;

a second selector configured to select and output any of the plurality of bits in a plurality of the second groups output from the plurality of memory modules based on the levels of the plurality of selection signals;

an ECC decoder configured to perform error detection/correction on a bit sequence obtained by synthesizing an output of the first selector and an output of the second selector; and a plurality of flip-flops each provided in a path through which a corresponding one of the selection signals is supplied to the first selector or the second selector, and a same clock signal is input to the plurality of flip-flops and the plurality of memory modules.

5. The semiconductor device according to claim 4, wherein the plurality of bits in the first group are odd bits of the plurality of bits constituting the output data of each of the plurality of memory modules, and the plurality of bits in the second group are even bits of the plurality of bits constituting the output data of each of the plurality of memory modules.

6. The semiconductor device according to claim 4, wherein the plurality of bits in the first group are higher-order half bits of the plurality of bits constituting the output data of each of the plurality of memory modules, and the plurality of bits in the second group are lower-order half bits of the plurality of bits constituting the output data of each of the plurality of memory modules.

7. The semiconductor device according to claim 1, wherein the plurality of memory modules include a first memory module and a second memory module, and the plurality of selection signals include a first selection signal to be input to the first memory module, and a second selection signal to be input to the second memory module, in a case where the selection decoder is in a normal state, when a selection enabling signal is at an activated level, the selection decoder sets any of the first selection signal and the second selection signal to an activated level, and when the selection enabling signal is at a deactivated level, the selection decoder sets both of the first selection signal and the second selection signal to a deactivated level, and when the selection enabling signal is at the activated level, if both of the first selection signal and the second selection signal are at the activated level or the deactivated level, the failure determination unit determines that the selection decoder is in the failed state.

8. The semiconductor device according to claim 7, wherein, when the selection enabling signal is at the deactivated level, if at least one of the first selection signal and the second selection signal is at the activated level, the failure determination unit determines that the selection decoder is in the failed state.

9. The semiconductor device according to claim 1, wherein the data is written in each of the plurality of memory modules only when the corresponding one of the selection signals is at the activated level.

10. The semiconductor device according to claim 1, wherein the data is read in each of the plurality of memory modules only when the corresponding one of the selection signals is at the activated level.

11. A semiconductor device comprising:

a plurality of memory modules, a plurality of bits indicating an address signal indicating a storage position of data in the plurality of memory modules including a first address bit and a second address bit, each of the plurality of memory modules receiving the second address bit and outputting an internal address bit generated from the second address bit;

a selection decoder configured to decode the first address bit and control levels of a plurality of selection signals; and a plurality of clock gates each configured to receive a clock, and output the clock to a corresponding one of the memory modules when a corresponding one of the selection signals is at an activated level, wherein when each of the plurality of memory modules receives the clock output from a corresponding one of the clock gates, each of the plurality of memory modules outputs the internal address bit generated from a newest value of the second address bit, the semiconductor device further comprising:

a selector configured to select any of the internal address bits output from the plurality of memory modules based on the levels of the plurality of selection signals; and a comparator configured to compare bits obtained by synthesizing the internal address bit output from the selector and the first address bit, with the address signal.

12. The semiconductor device according to claim 11, wherein each of the plurality of memory modules keeps holding a value of the internal address bit until each of the plurality of memory modules receives the clock from the corresponding one of the clock gates.

13. The semiconductor device according to claim 11, wherein the plurality of memory modules include two memory modules, and the first address bit is a most significant bit of the address signal.

14. A memory module comprising:

a first address input terminal to which a first address signal is input;

a clock input terminal to which a clock signal is input;

a memory array having a plurality of memory cells selectable by word lines;

a data input/output terminal from which data from the memory cells is output and to which data to the memory cells is input;

a failure notification output terminal from which a first failure notification signal is output;

a temporary storage circuit configured to capture the first address signal in synchronization with the clock signal, and output the first address signal as an internal address bit;

an address decoder configured to output an address decoding signal based on the internal address bit;

a word line driving circuit configured to select and drive a corresponding word line in the memory array based on the address decoding signal;

a data input/output unit configured to output data in one of the memory cells selected by the word line to the data input/output terminal; and a first comparator configured to compare a second address signal with the internal address bit to generate the first failure notification signal, and output the first failure notification signal to the failure notification output terminal.

15. The memory module according to claim 14, wherein the first address signal includes a first number of lower-order bits of an address signal generated by an address separator configured to separate an address signal output from a CPU, and the memory module comprises a second address input terminal configured to receive the first number of lower-order bits of the address signal directly from the CPU, as the second address signal.

16. The memory module according to claim 14, comprising:

a test address input terminal to which a test address signal is input; and a first selector configured to select one of the test address signal and the first address signal, and supply the selected signal to the first comparator as the second address signal.

17. The memory module according to claim 15, comprising a second selector configured to receive the data in one of the memory cells supplied from the data input/output unit and the internal address bit, select any one of the data and the internal address bit as memory module output data, and output the memory module output data to the data input/output terminal, wherein when the second selector receives the first failure notification signal from the first comparator, the second selector selects the internal address bit, and when the second selector does not receive the first failure notification signal from the first comparator, the second selector selects the data in one of the memory cells.

18. A semiconductor device comprising:

the plurality of memory modules according to claim 15;

the CPU; and an interrupt control unit configured to send the CPU an interrupt notification, wherein the address signal output from the CPU indicates a storage position of data in the plurality of memory modules, the semiconductor device further comprising:

the address separator configured to separate the address signal into a first address bit having a second number of higher-order bits and a second address bit having the first number of lower-order bits, wherein the first address input terminal in each of the plurality of memory modules receives the second address bit as the first address signal, the semiconductor device further comprising:

a second comparator configured to compare the first address bit output from the address separator with an address bit having the second number of higher-order bits of the address signal sent directly from the CPU to generate a second failure notification signal, and output the second failure notification signal to the interrupt control unit;

a selection decoder configured to decode the address bit having the second number of higher-order bits of the address signal and control levels of a plurality of selection signals; and a third selector configured to select any of the first failure notification signals output from the plurality of memory modules based on the levels of the plurality of selection signals, and output the selected first failure notification signal to the interrupt control unit.

19. A semiconductor device comprising:

the plurality of memory modules according to claim 17;

the CPU;

an interrupt control unit configured to send the CPU an interrupt notification; and an error address holding circuit configured to hold an error address, wherein the address signal output from the CPU indicates a storage position of data in the plurality of memory modules, the semiconductor device further comprising:

the address separator configured to separate the address signal into a first address bit having a second number of higher-order bits and a second address bit having the first number of lower-order bits, wherein the first address input terminal in each of the plurality of memory modules receives the second address bit as the first address signal, the semiconductor device further comprising:

a second comparator configured to compare the first address bit output from the address separator with an address bit having the second number of higher-order bits of the address signal sent directly from the CPU to generate a second failure notification signal, and output the second failure notification signal to the interrupt control unit;

a selection decoder configured to decode the address bit having the second number of higher-order bits of the address signal and control levels of a plurality of selection signals; and a fourth selector configured to select any of the first failure notification signals output from the plurality of memory modules based on the levels of the plurality of selection signals, and output the selected first failure notification signal to the interrupt control unit and the error address holding circuit, wherein the fourth selector selects any of the memory module output data output from the plurality of memory modules based on the levels of the plurality of selection signals, and outputs the selected memory module output data to the error address holding circuit, and when the error address holding circuit receives the first failure notification signal, the error address holding circuit holds the memory module output data output from the fourth selector.

20. The semiconductor device according to claim 19, wherein the error address holding circuit receives the first address bit output from the address separator, the second comparator outputs the second failure notification signal to the error address holding circuit, and when the error address holding circuit receives the second failure notification signal, the error address holding circuit holds the first address bit.

* * * * *